(12) United States Patent
Tsuji et al.

(10) Patent No.: US 7,116,396 B2
(45) Date of Patent: Oct. 3, 2006

(54) EXPOSURE DEVICE, EXPOSURE METHOD AND DEVICE MANUFACTURING METHOD

(75) Inventors: Toshihiko Tsuji, Saitama (JP); Takaaki Kimura, Kounosii (JP); Yoshitomo Nagahashi, Takasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/944,783

(22) Filed: Sep. 21, 2004

(65) Prior Publication Data

US 2005/0140959 A1    Jun. 30, 2005

Related U.S. Application Data

(63) Continuation of application No. PCT/JP03/03539, filed on Mar. 24, 2003.

(30) Foreign Application Priority Data

Mar. 22, 2002 (JP) ............................. 2002-082044

(51) Int. Cl.
    *G03B 27/53* (2006.01)
(52) U.S. Cl. ........................... 355/30; 355/53; 355/72; 355/75
(58) Field of Classification Search .................. 355/30, 355/53, 72, 75; 310/10, 12; 356/401, 500
    See application file for complete search history.

(56) References Cited

U.S. PATENT DOCUMENTS 4,916,340 A    4/1990   Negishi ...................... 310/12

5,959,732 A *  9/1999   Hara et al. ................ 356/500
2001/0001248 A1  5/2001  Emoto ....................... 355/53
2001/0055102 A1 12/2001  Emoto ....................... 355/53

FOREIGN PATENT DOCUMENTS

| JP | A 1-195389 | 8/1989 |
| JP | A 3-2912 | 1/1991 |
| JP | A 10-97977 | 4/1998 |
| JP | A 11-307430 | 11/1999 |
| JP | A 2001-7015 | 1/2001 |
| JP | A 2001-290543 | 10/2001 |
| KR | 1999-0083450 | 11/1999 |

* cited by examiner

*Primary Examiner*—D. Rutledge
(74) *Attorney, Agent, or Firm*—Oliff & Berridge PLC

(57) ABSTRACT

An exposure device, where circulating systems and for controlling a temperature varied by the driving of a linear motor are connected to a reticle stage and wafer stage, a controller sets the temperature of refrigerant circulating through the circulating system by driving heater, circulating system is connected to a projection optical system and a controller sets the temperature of refrigerant circulating through a circulating system by driving heater by a feed-forward control to control the temperature of the refrigerant circulating through the circulating system.

40 Claims, 14 Drawing Sheets

EXPOSURE DEVICE, EXPOSURE METHOD AND DEVICE MANUFACTURING METHOD

This is a Continuation of Application No. PCT/JP03/003539 filed Mar. 24, 2003.

BACKGROUND OF THE INVENTION

1. Field of the Invention

The present invention relates to an exposure device and exposure method which transfer a pattern formed on a mask or reticle onto a substrate such as a wafer, and also to a device manufacturing method for manufacturing semiconductor devices, liquid crystal display devices, image pickup devices, thin-film magnetic heads, and other devices using the exposure device and exposure method.

2. Description of Related Art

In a photolithographic step, which is one of the steps for manufacturing semiconductor devices, liquid crystal display devices, image pickup devices, thin-film magnetic heads, and other devices, an exposure device is used that transfers a pattern that is formed on a mask or reticle (hereinafter, when referring to these generically, they will be referred to as masks) onto a wafer or glass or the like (hereinafter, when referring to these generically, they will be referred to as substrates) on which a photosensitive agent such as photoresist has been coated.

In recent years, step-and-repeat types of exposure device, for example, reduction projection types exposure device (what are known as steppers) or step-and-scan types exposure device are widely used. These step-and-repeat types exposure device are apparatuses that hold a substrate on a stage that is able to move freely two-dimensionally, and by moving the substrate in steps using this stage, repeatedly perform an operation in which a pattern image on a article is sequentially exposed onto each shot area on a substrate such as a wafer. The aforementioned step-and-scan types exposure device are apparatuses that, when transferring a pattern on a reticle onto a predetermined shot area on a wafer, sequentially transfer the pattern formed on the reticle onto the shot area while moving the reticle and wafer in synchronization.

In recent years, among the aforementioned devices, there have been considerable advances, in particular, in the further integration of semiconductor devices and, for example, process rules have become extremely minute at approximately 0.13 µm. As a result, exposure devices have achieved an improvement in resolution, and an improvement in the positioning accuracy of the pattern image on the reticle that is projected via a projection optical system relative onto the shot area of the wafer. Specifically, in order to improve the resolution, for example, a wavelength reduction in the wavelength of the exposure light and a high numerical aperture (NA) in the projection optical system have been achieved, while in order to improve positioning accuracy, for example, precise and rigorous control of the baseline amount is conducted.

The baseline amount is the distance between a reference point (for example, the center of the projection) of the pattern image on the reticle that is projected onto the wafer and a reference point (for example, the center of the measured field of vision) of an off-axis type of alignment sensor. In order to measure alignment marks that are formed on a wafer, a variety of alignment sensors are provided in an exposure device, and one of these is an off-axis type of alignment sensor that is placed in the vicinity of a side portion of a projection optical system. If this type of alignment sensor is used, a position that is obtained by correcting the result of a measurement by the alignment sensor using the baseline amount becomes the position where each shot area is located during an exposure. Accordingly, by accurately controlling the baseline amount, it is possible to achieve an improvement in the accuracy with which the projected pattern is superimposed on the shot area.

In the manufacture of devices in recent years, because there has been a demand for an improvement in productivity, there is a need to improve throughput, namely, to improve the number of wafers that are processed in a unit time. In order to improve throughput, in a step-and-repeat type exposure device, by raising the rate of acceleration of the wafer stage, a reduction in the time required for acceleration and deceleration is achieved. In a step-and-scan type exposure device, in addition to improving the acceleration and deceleration of the wafer stage and the reticle stage, by improving the scanning speed of the wafer stage and reticle stage during exposure, a reduction in the time required for exposure is achieved.

However, in order to improve throughput, if the rate of acceleration of the wafer stage or reticle stage is improved and acceleration and deceleration is frequently repeated, the quality of heat generated by the motor that drives the wafer stage or by the motor that drives the reticle stage is increased. Because these motors are provided inside the exposure device, each time an exposure operation is repeated there is a large variation in the temperature inside the exposure device. In a step-and-scan type exposure device, in particular, because both the wafer stage and the reticle stage are driven by motors during an exposure (i.e., during the transfer of a pattern), the rate of temperature change is considerable. A change in temperature is generated inside the exposure device not only by the motors provided in the wafer stage and reticle stage, but also when drive systems (for example, the lens drive system of the projection optical system and the reticle blind drive system) inside the exposure device are driven.

If the temperature inside the exposure device changes, a change (for example, a change in the best focus position and a change in aberration) is generated in the optical characteristics of the projection optical system. As a result, deterioration in the resolution and the like occurs and problems arise when a detailed pattern is being transferred. Moreover, because thermal expansion and thermal deformation are generated in the alignment sensors and the stages by changes in temperature inside the exposure device, there is a concern that a variation in the baseline amount (i.e., baseline drift) will occur during exposure. Because of this, the problem arises that a deterioration in accuracy occurs when the projected pattern and the shot area are overlayed. In addition, the temperature of the atmosphere surrounding the stages is raised by the heat generated by the stages, and the problem arises that the stage positioning accuracy is worsened by the effects such as fluctuations in the optical path of the interferometer that measures the positions of the stages.

Accordingly, in order to prevent reductions in the resolution, reductions in the accuracy of the overlay, and reductions in the stage positioning accuracy, it is necessary to maintain a constant temperature inside the exposure device. Because of this, conventional exposure devices are provided with a temperature sensor that detects the temperature inside the exposure device and with a temperature control device, and, based on detection results from the temperature sensor, the temperature control device conducts feedback control so as to maintain a constant temperature inside the exposure device. Either air-cooled or liquid-cooled temperature control devices may be used as this temperature control device, however, commonly, exposure devices are provided with liquid-cooled types of temperature control device as these have an excellent cooling performance.

However, using as an example an exposure device that is provided with, for example, a liquid-cooled type of temperature control device, the diameter of pipes that are used to conduct temperature-controlled coolant in the vicinity of a heat generating source such as a motor is restricted by the size of the exposure device and by space limitations inside the exposure device. Moreover, because it is clearly not possible to use any optional component as a pipe, the pressure inside the pipes is restricted and the flow rate is also limited. Furthermore, in order to perform temperature control, it is desirable that the temperature control apparatus be located extremely close to the heat generating source, however, it is not always possible to employ this type of structure due to the structure limitations of the apparatus. Accordingly, due to the restrictions of this type of apparatus structure, there is an increase in time wastage due to control.

In order for exposure devices of recent years to provide the expected performance, for example, the temperature of the wafer stage and reticle stage must be controlled within a range of approximately 1/10° C., and the temperature of the projection optical stem must be controlled within a range of approximately 1/100° C. However, if the aforementioned time wastage is considerable, then in a conventional temperature control device that only uses feedback control, it is difficult to conduct this type of high precision temperature control. Moreover, in recent years, wafer stages and reticle stages have had to increase in size to keep pace with the increase in size of wafer diameters, so that the heat capacity thereof has increased as has the thermal time constant. Furthermore, because the ability to drive the reticle stage and wafer stage at high speed is more and more in demand in order to improve throughput, the quantity of heat generated by the motors that drive the reticle stage and wafer stage is also increasing, and highly accurate temperature control in the above described temperature range has become more difficult.

It is an aim of the present invention to provide an exposure device and exposure method as well as a device manufacturing method that uses this exposure device and exposure method that result in it being possible to improve device manufacturing efficiency by maintaining the performance of an exposure device consistently at the expected performance, by performing temperature control inside the exposure device with a high degree of accuracy even if time wastage due to control does occur.

SUMMARY OF THE INVENTION

Note that symbols in parentheses in the description given below simply show relationships with structures and elements in the embodiments described below, and do not in any way limit those elements.

The exposure device according to the first aspect of the present invention projects via a projection optical system an image of a pattern formed on a reticle that is held on a reticle stage onto a substrate that is held on a substrate stage, and includes: a movable device which is provided with a drive source and which performs a predetermined operation using the drive source; and a temperature control system which controls a temperature of the movable device, wherein the temperature control system controls the temperature of the movable device using feedforward control.

According to this invention, because a temperature control system controls the temperature of a movable device using feedforward control so that temperature changes in the movable device can be rapidly dressed, even if time wastages were to occur due to control, it is still possible to set the temperature inside an exposure device to a target temperature with a high degree of accuracy. As a result, the performance of the exposure device can be consistently maintained at the performance that is anticipated.

The exposure device according to the second aspect of the present invention projects via a projection optical system an image of a pattern formed on a reticle that is held on a reticle stage onto a substrate that is held on a substrate stage, and includes: an object of control in which temperature variations are generated; a temperature control system which controls the temperature of the object of control by circulating a fluid to the object of control; an input device which inputs at least one of information relating to pipes through which the fluid is circulated, information relating to a flow velocity of the fluid, and information relating to a flow rate of the fluid; and a setting device which sets control characteristics of the temperature control system based on information of the parameters that is input by the input device.

According to this invention, because the setting device sets control characteristics of the temperature control system based on at least one of information that is input by the input device relating to the path of fluid, information relating to the flow velocity of the fluid, and information relating to the flow rate of the fluid, the control characteristics of the temperature control system can be optimally set and updated in accordance with the flow path of the fluid (i.e., the installation conditions when the exposure device is installed, and specifically, conditions relating to the fluid pipes, more specifically, information relating to the pipe length and/or pipe diameter), the flow velocity of the fluid (i.e., one of the conditions when circulating the fluid to the object of control), and the flow rate (amount per unit time) of the fluid (i.e., one of the conditions when circulating the fluid to the object of control). As a result, it is possible to set (update) the temperature inside an exposure device to a target temperature with a high degree of accuracy, and the performance of the exposure device can be consistently maintained at the performance that is anticipated. Moreover, because the control characteristics of the temperature control system are set to the optimum by inputting at least one of information relating to the path of the fluid, information relating to the flow velocity of the fluid, and information relating to the flow rate of the fluid via the inputting device, then, for example, there is no need to determine and set the control characteristics of the temperature control system by repeated trial and error when installing the exposure device, and it is possible to shorten the time required to install the exposure device.

The exposure device according to the third aspect of the present invention includes: an exposure main body section which projects via a projection optical system an image of a pattern formed on a reticle that is held on a reticle stage onto a substrate that is held on a substate stage; and a temperature control system which controls a temperature of an object of control in which temperature variations are generated by circulating a fluid to the object of control, wherein the temperature control system includes: a first setting device which sets the temperature of the fluid within a predetermined temperature range; a second setting device which sets the temperature of the fluid that is temperature controlled by the first temperature control system within a temperature range that is smaller than the predetermined temperature range; and a control device which controls an operation of at least the second setting device, and when the second setting device and the control device are located away from the first setting device, and also closer to the vicinity of the object of control than the first setting device.

According to the present invention, because the second setting device and the control device are located away from the first setting device, and also closer to the vicinity of the object of control than the first setting device, it is possible to shorten time wastages due to control and, consequently, it is possible to set the temperature inside an exposure device to a target temperature with a high degree of accuracy, and the performance of the exposure device can be consistently maintained at the performance that is anticipated.

The device manufacturing method of the present invention includes a step of transferring a pattern that is formed on the reticle onto the substrate using the above described exposure device. According to this invention, because it is possible to transfer a pattern that is formed on a reticle onto a substrate using an exposure device that is consistently maintained at the expected performance, it is possible to faithfully transfer a finely detailed pattern onto a predetermined position on the substrate, thereby resulting in it being possible to improve the device manufacturing efficiency.

In addition, the exposure method of the present invention projects via a projection optical system an image of a pattern formed on a reticle that is held on a reticle stage onto a substrate that is held on a substrate stage, and includes: an input step that inputs as a parameter at least one of information relating to pipes through which he fluid is circulated to an object of control, information relating to a flow velocity of the fluid, and information relating to a flow rate of the fluid; and a setting step that, based on the parameter information that is input in the input step, sets control characteristics of the temperature control system that controls the temperature of the object of control by circulating the fluid to the object of control.

According to this invention, in the same way as in the exposure device according to the above described second aspect, it is possible to set the control characteristics of the temperature control system to the optimum in accordance with the fluid flow path, the fluid flow velocity, and the fluid flow rate, and, as a result, it is possible to set the temperature inside an exposure device to a target temperature with a high degree of accuracy, and the performance of the exposure device can be consistently maintained at the performance that is anticipated. In addition, it is possible to shorten the time required to install the exposure device.

The exposure device according to the fourth aspect of the present invention projects via a projection optical system an image of a pattern formed on a reticle that is held on a reticle stage onto a substrate that is held on a substrate stage, and includes: an object of control in which temperature variations are generated; a temperature control system that controls the temperature of the object of control by circulating a fluid to the object of control; an input device that inputs as a parameter information relating to an exposure procedure for exposing a pattern on the reticle onto the substrate; and a setting device that sets control characteristics of the temperature control system based on the parameter information that is input by the input device.

According to this invention, because the setting device sets control characteristics of the temperature control system based on information relating to the exposure procedure (i.e., shot map information, information relating to the scanning procedure (i.e., scan direction) during a scan exposure, and information relating to the movement speed and rate of acceleration of a stage), it is possible to achieve the optimum temperature control in accordance with this exposure procedure. In addition, it is possible to achieve temperature control that is extremely accurate, and that can be adapted excellently to a variety of processing programs set by a user.

The exposure device according to the fifth aspect of the present invention projects via a projection optical system an image of a pattern formed on a reticle that is held on a reticle stage onto a substrate that is held on a substrate stage, and includes: a drive source that drives a movable device; a temperature control system which controls the temperature of the drive source by circulating a fluid to the drive source; a measuring device which measures a period from when the drive source stops a driving of the movable device until the drive source next restarts a driving of the movable device; and a setting device which sets control characteristics of the temperature control system based on the measurement results from the measuring device.

According to the present invention, based on the stoppage period of the drive source (i.e., the heat generating source), because the setting device sets the control characteristics of the temperature control system, it is possible to automatically perform the optimum temperature management that corresponds to this stoppage period, and, as a result, it is possible to achieve highly accurate temperature control of that drive source.

The exposure device according to the sixth aspect of the present invention projects via a projection optical system an image of a pattern formed on a reticle that is held on a reticle stage onto a substrate that is held on a substrate stage, and includes: a drive source which drives a movable device; a temperature control system which controls the temperature of the drive source using a feedforward control method or a control method other than the feedforward control method by circulating a fluid to the drive source; a measuring device which measures a period from when the drive source stops a driving of the movable device until the drive source next restarts a driving of the movable device; and a determining device which, based on measurement results from the measuring device, determines whether to execute the feedforward control method in the temperature control system or whether to execute a control method other than the feedforward control method in the temperature control system.

According to the present invention, because it is possible to automatically determine and use the appropriate temperature control method that is most suitable for each occasion (i.e., to determine whether to perform feedforward control or some other control method such as, for example, feedback control) based on the stoppage period of the drive source (i.e., the heat generating source), it is possible to automatically perform the optimum temperature management that corresponds to this stoppage period, and it is possible to achieve extremely highly accurate temperature control of that drive source.

The exposure method according to the second aspect of the present invention projects via a projection optical system an image of a pattern formed on a reticle that is held on a reticle stage onto a substrate that is held on a substrate stage, and includes: an input step of inputting as a parameter information relating to an exposure procedure for exposing a pattern on the reticle onto the substrate; and a setting step, based on the parameter that is input in the input step, of setting control characteristics of the temperature control system which controls the temperature of an object of control, in which temperature variations are generated, by circulating fluid to the object of control.

According to the present invention, in the same way as in the exposure device according to the fourth aspect, it is possible to achieve temperature control that is extremely accurate and that can be adapted excellently to a variety of processing programs (i.e., information relating to an exposure process) set by a user.

The exposure method according to the third aspect of the present invention projects via a projection optical system an image of a pattern formed on a reticle that is held on a reticle stage onto a substrate that is held on a substrate stage, and includes: a measuring step of measuring a period from when a drive source that drives a movable device stops a driving of the movable device until the drive source next restarts a driving of the movable device; and a setting step, based on measurement results from the measuring step, of setting control characteristics of the temperature control system which controls the temperature of the drive source by circulating fluid to the drive source.

According to the present invention, in the same way as in the exposure device according to the fifth embodiment is possible to automatically perform the optimum temperature management that corresponds to the stoppage period of a drive source (i.e., a heat generating source), and, as a result, it is possible to achieve highly accurate temperature control of that drive source.

The exposure method according to the fourth aspect of the present invention projects via a projection optical system an image of a pattern formed on a reticle that is held on a reticle stage onto a substrate that is held on a substrate stage, and includes: a measuring step of measuring a period from when a drive source that drives a movable device stops a driving of the movable device until the drive source next restarts a driving of the movable device; and a determining step, based on measurement results from the measuring step, of determining which control method will be executed by a temperature control system which controls the temperature of the drive source using a feedforward control method or a control method other than a feedforward control method by circulating fluid to the drive source.

According to this invention, in the same way as in the exposure device according to the sixth aspect, because it is possible to automatically determine and use the appropriate temperature control method that is most suitable for each occasion (i.e., to determine whether to perform feedforward control or some other control method, it is possible to automatically perform the optimum temperature management that corresponds to this stoppage period of the drive source, and, as a result, it is possible to achieve extremely highly accurate temperature control of that drive source.

BRIEF DESCRIPTION OF THE DRAWINGS

FIG. 10A changes in temperature when a heater 78 is driven using feedforward control and feedback control, while FIG. 10B shows changes in temperature when the heater 78 is driven using only feedback control.

DETAILED DESCRIPTION OF THE INVENTION

The exposure device, exposure method, and device manufacturing method according to embodiments of the present invention will now be described in detail with reference made to the drawings. However, it should be understood that these are exemplary of the invention and are not to be considered as limiting. Additions, omissions, substitutions, and other modifications can be made without departing from the spirit or scope of the present invention.

First Embodiment

Figure 1:
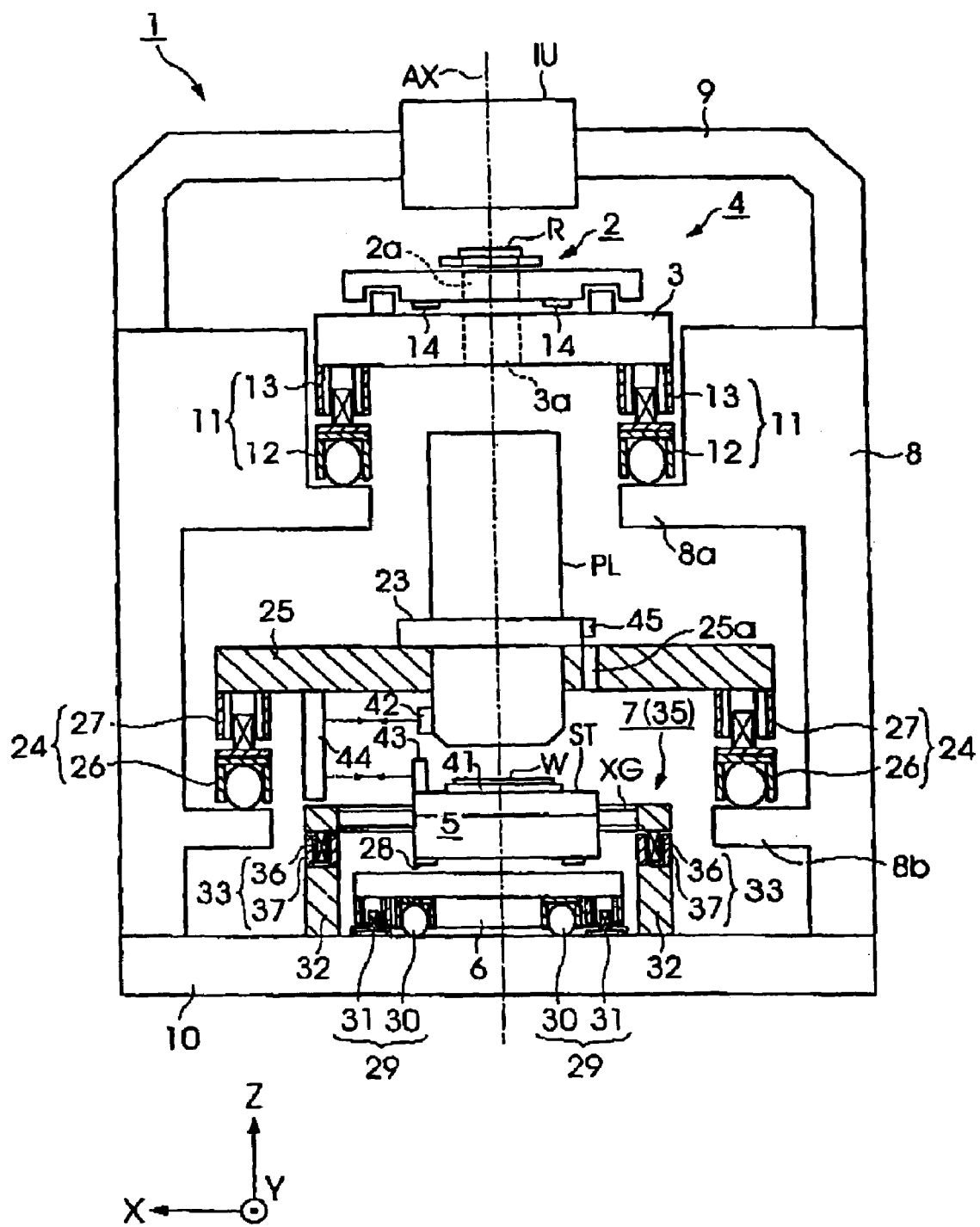
FIG. 1 is a schematic view of an entire exposure device according to the first embodiment of the present invention.

FIG. 1 is a schematic view of the entire exposure device according to the first embodiment of the present invention. In the present embodiment, a description is given using as an example a case in which the present invention is applied to a step-and-scan type exposure device that manufactures a semiconductor device by transferring a pattern that is formed on a reticle R onto a wafer W, while moving the reticle R serving as a mask and the wafer W serving as a substrate relatively to a projection optical system PL shown in FIG. 1.

In the description given below, the XYZ rectangular coordinate system shown in FIG. 1 is set, and a description is given of positional relationships between each member while referring to this XYZ rectangular coordinate system. In the XYZ rectangular coordinate system, the X axis and Y axis are set so as to be parallel to the wafer W, while the Z axis is set so as to be a perpendicular direction (i.e., in a direction along the optical axis AX of the projection optical system PL) relative to the wafer W. In the XYZ coordinate system in the drawings, in actual fact, the XY plane is set on a plane that is parallel to a horizontal plane, while the Z axis is set in a vertically upright direction. In addition, in the present embodiment, during exposure (i.e., during pattern transfer), the direction in which the reticle R and the wafer W are moved (i.e., the scan direction) is set to the Y direction. Directions of rotation around the respective axes an θZ, θY, and θX.

An exposure device 1 shown in FIG. 1 is schematically formed by an illumination optical system IU, a stage apparatus 4, a projection optical system PL, a stage apparatus 7, and a reaction frame 8. The illumination optical system IU illuminates at a uniform illumination intensity a rectangular shaped (or a circular arc shaped) illumination area on the reticle R, which serves as a mask, using illumination light for exposure from a light source (not shown). The stage apparatus 4 is constructed so as to include a reticle stage 2 serving as a mask stage that moves the reticle R while holding it, and a reticle base plate 3 that supports the reticle stage 2. The projection optical system PL projects a pattern formed on the reticle R at a reduction magnification of 1/α (wherein α is, for example, 5 or 4) onto the wafer W serving as a substrate. The stage apparatus 7 is constructed so as to include a wafer stage 5 serving as a substrate stage that moves the wafer W while holding it, and a wafer plate 6 that holds the wafer stage 5. The reaction frame 8 supports the stage apparatus 4 and the projection optical system PL.

The illumination optical system IU is supported by a supporting column 9 that is fixed to a top surface of the reaction frame 8. For the illumination light that is used for exposure, it is possible to use, for example, bright rays in an ultraviolet region (i.e., g-rays and i-rays) that are emitted from an extra-high pressure mercury lamp, distant ultraviolet light (DUV) such as KrF excimer laser light (having a wavelength of 248 nm), or vacuum ultraviolet light (VUV) such as ArF excimer laser light (having a wavelength of 193 nm) or $F_2$ light (having a wavelength of 157 nm). The reaction frame 8 is placed on top of a base plate 10 that is mounted horizontally on the floor. Step portions 8a and 8b that protrude inwards are formed respectively on a top portion side and a bottom portion side of the reaction frame 8.

The reticle base plate 3, which forms a portion of the stage apparats 4, is supported at each corner substantially horizontally via anti-vibration units 11 by the step portions 8a of the reaction frame 8. An aperture portion 3a through which a pattern image that is formed on the reticle R passes is formed in a center portion of the reticle base plate 3. In FIG. 1, only the anti-vibration units 11 that are positioned in the X direction are shown, and the anti-vibration units 11 that are positioned in the Y direction have been omitted.

Metal or ceramic can be used for the material of the reticle base plate 3. The anti-vibration units 11 are constructed by placing air mounts 12, whose internal pressure can be adjusted, and voice coil motors 13 in a straight line on the step portion 8a. Minute vibrations that are transmitted to the reticle base plate 3 via the base plate 10 and the reaction frame 8 are isolated at a micro G level (wherein G is the gravitational acceleration) by the anti vibration units 11.

The reticle stage 2 is supported on top of the reticle base plate 3 so as to be able to move two-dimensionally along the reticle base plate 3. A plurality of air bearings (i.e., air pads) 14 is fixed to a bottom surface of the reticle stage 2. The reticle stage 2 is supported floating above the reticle base plate 3 via a clearance of several microns by the air bearings 14. An aperture 2a, through which passes a pattern image on the reticle R, is formed in a center portion of the reticle stage 2 and is linked with the aperture portion 3a of the reticle base plate 3.

Figure 2:
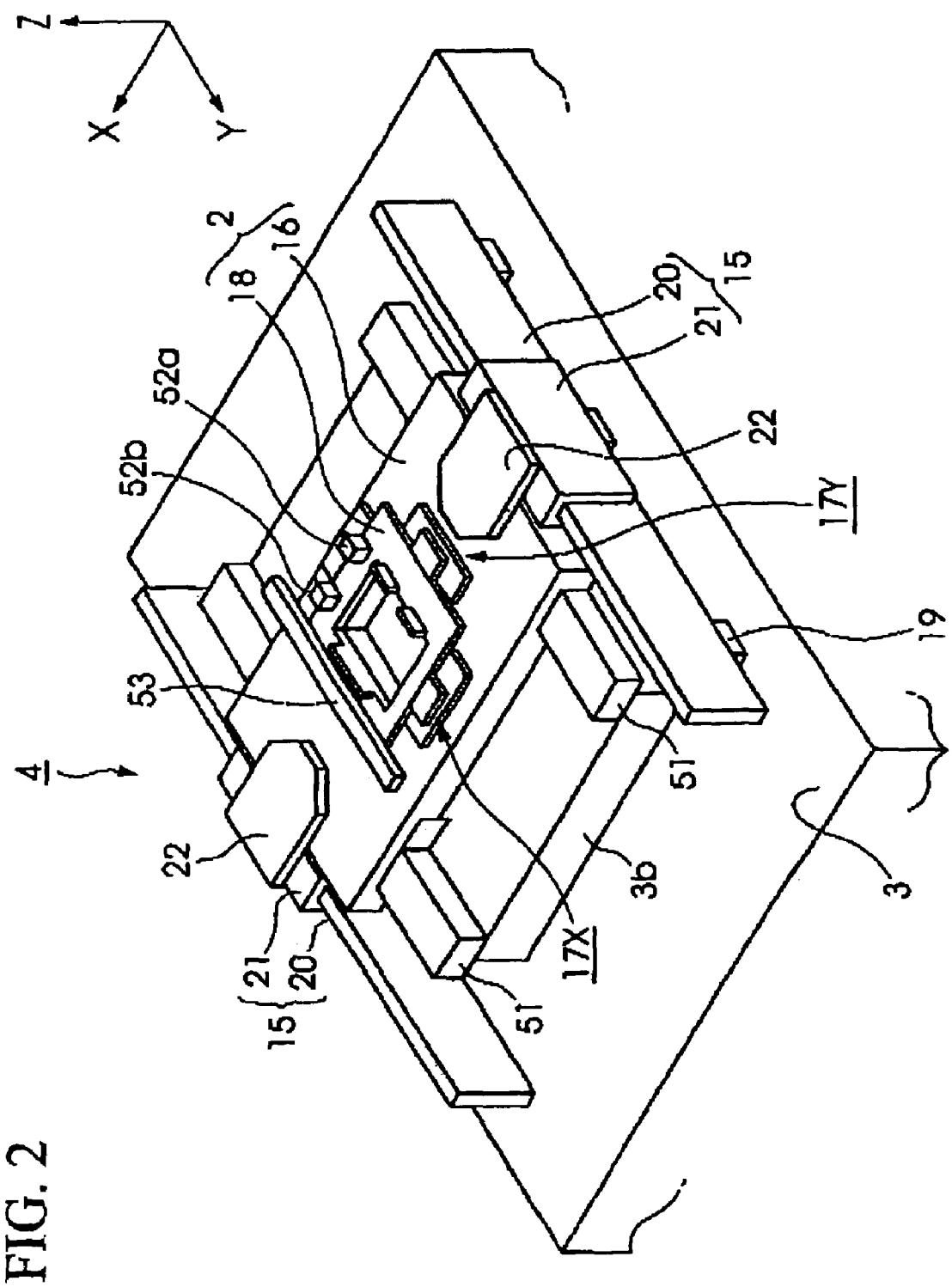
FIG. 2 is an external perspective view of a reticle stage that is provided in the exposure device according to the first embodiment of the present invention.

The reticle stage 2 will now be described in detail. FIG. 2 is an external perspective view of a reticle stage that is provided in the exposure device according to the first embodiment of the present invention. As is shown in FIG. 2, the reticle stage 2 is provided with a reticle coarse movement stage 16 that is driven across the top of the reticle base plate 3 at a predetermined stroke in the Y axial direction by a pair of Y linear motors (i.e., drive sources) 15 and 15, and a reticle fine movement stage 18 that is driven fine (micro) distances in the X, Y, and θZ directions across the top of the reticle coarse movement stage 16 by a pair of X voice coil motors (i.e., drive sources) 17X and a pair of Y voice coil motors (i.e., drive sources) 17Y. In this manner, the reticle stage 2 is formed by the reticle coarse movement stage 16 and the reticle fine movement stage 18, however, in FIG. 1, these are shown in simplified form. The reticle stage 2 that is driven by the Y linear motors 15 and 15, the reticle coarse movement stage 16, and the X voice coil motor 17X and the Y voice coil motor 17Y as drive sources corresponds to the movable device or to a portion of the controlled object described in the present invention.

Each of the Y linear motors 15 is formed by a static element 20 that extends in the Y axial direction and that is supported floating above the reticle base plate 3 by a plurality of air bearings (i.e., air pads) 19, which are non-contact bearings, and by movable elements 21 that are provided to correspond to the static elements 20 and are fixed to the reticle coarse movement stage 16 via linking members 22. As a result, by the law of conservation of momentum, the static elements 20 are moved in a negative Y direction as counter mass correspondingly to a movement of the reticle coarse movement stage 16 in a positive Y direction.

It is possible to cancel out the reaction force that accompanies the movement of the reticle coarse movement stage 16 using the movement of the static elements 20, and to prevent changes in the position of the center of gravity. Because the movable elements 21 and the static elements 20 are coupled together in the Y linear motor 15, when these are displaced relatively, a force that tries to remain in the original position acts thereon. Therefore, in the present embodiment, a trim motor 72 (i.e., a drive source; not shown in FIG. 2—see FIG. 6) is provided that corrects an amount of movement of the static elements 20 such that the static elements 20 arrive at a predetermined position.

The reticle coarse movement stage 16 is guided in the Y axial direction by a pair of Y guides 51 and 51 that extend in the Y axial direction and arm fixed to a top surface of a top protruding portion 3b that is formed in a center portion of the reticle base plate 3. In addition, the reticle coarse movement stage 16 is supported by air bearings (not shown) on these Y guides 51 and 51 so as not to be in contact with the Y guides 51 and 51.

A reticle R is held by suction on the reticle fine movement stage 18 via a vacuum chuck (not shown). A pair of Y movement mirrors 52a and 52b that are composed of corner cubes are fixed to the negative Y direction end portion of the reticle fine movement stage 18, while an X movement mirror 53 that is composed of a planar mirror that extends in the Y axial direction is fixed to the positive X direction end portion of the reticle fine movement stage 18. The position of the reticle stage 2 in the X direction and Y direction, as well as the rotation θZ around the Z axis can be measured with a high degree of accuracy by three laser interferometers (not shown) that irradiate measuring beams onto the Y movement mirror 52a and 52b and the X movement mirror 53 measuring the distances between themselves and each movement mirror.

Returning to FIG. 1, the projection optical system PL includes a plurality of refractive optical elements (i.e., lens elements), and has a circular projected visual field in which both the substrate surface (i.e., the reticle R side) and the image surface (i.e., the wafer W) side are telecentric. The nitrate material of the plurality of refractive optical elements provided in the projection optical system PL may be selected, for example, from quartz or fluorite in accordance with the wavelength of the illumination light for exposure. When the illumination light that is emitted from the illumination optical system IU illuminates the reticle R, illumination light that passes through the reticle R strikes the projection optical system PL, and a partial inverted image of the pattern that is formed on the reticle is formed in the center of the circular visual field of the image surface side of the projection optical system PL while being restricted to a slit configuration. As a result, the projected partial image of the pattern is transferred at a reduced size onto a resist layer on the surface of one shot area out of the plurality of shot areas on a wafer W that has been placed on the image plane of the projection optical system PL.

Figure 3:
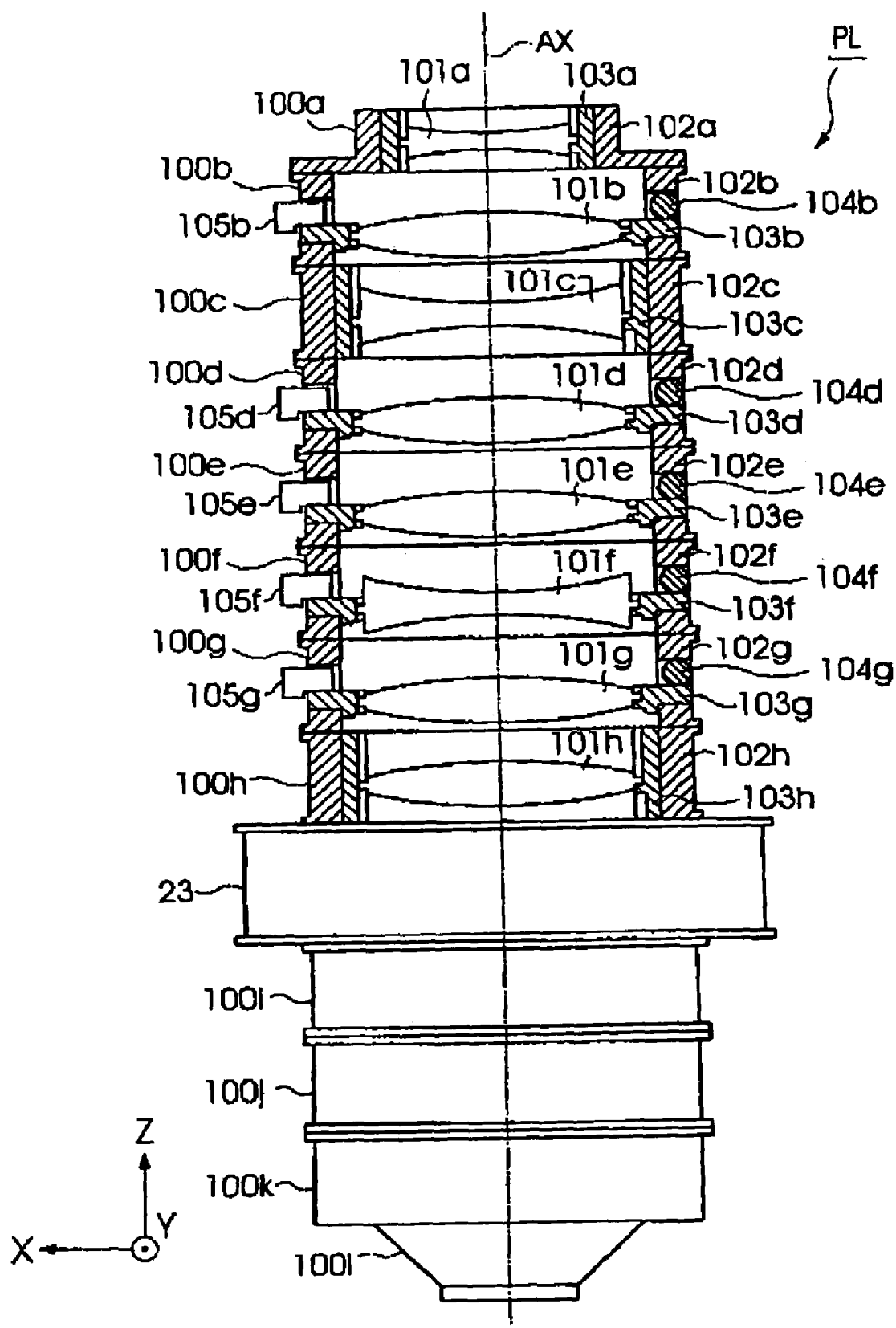
FIG. 3 is a schematic view of a projection optical system that is provided in the exposure device according to the first embodiment of the present invention.

The structure of the projection optical system PL will now be described in detail. FIG. 3 is a schematic view of the projection optical system that is provided in the exposure device according to the first embodiment of the present invention. As is shown in FIG. 3, the projection optical system PL is provided with a plurality of split lens barrels 100a to 100l that are stacked in the direction of the optical axis AX, and is supported by a lens barrel base plate 25 that is shown in FIG. 1 via a flange 23. In the present embodiment, lens elements 101b, 101d, 101e, 101f, and 101g that are supported by split lens barrels 100b, 100d, 100e, 100f, and 100g from among the plurality of split lens barrels 100a to 100l are formed by movable lens elements that are able to move in the optical axis AX direction (i.e., the Z direction) and are also able to tilt using the X direction or the Y direction as an axis.

A description will now be given of the structure of the split lens barrels 100b, 100d, 100e, 100f, and 100g that hold the lens elements 101b, 101d, 101e, 101f, and 101g taking the structure of the split lens barrels 100b as representative thereof. The structures of the other split lens barrels 100d, 100e, 100f, and 100g are substantially the same as the structure of the lens barrel 100b and accordingly a description of these is omitted here.

The split lens barrel 100b is provided with an outer ring 102b that is connected to split lens barrels 100a and 100c that are positioned above and below (in the Z direction) of the split lens barrel 100b, and a lens chamber 103b that holds the lens element 101b. The lens chamber 103b is linked with the outer ring 102b such that the lens chamber 103b is able to move along the optical axis AX direction (i.e., the Z direction) relative to the outer ring 102b, and is also able to tilt around an axis that is parallel with the X axis or around an axis that is parallel with the Y axis.

In addition, the split lens barrel 100b is provided with actuators (i.e., drive sources) 104b that are mounted on the outer ring 102b. A piezoelectric element, for example, can be used for the actuators 104b. The actuators 104b drive the lens chamber 103b via a link mechanism in the form of a displacement expansion mechanism that may be formed, for example, by an elastic hinge. The actuators 104b are attached at three locations to the split lens barrel 100b at an angle of azimuth of 120° within the XY plane, resulting in three locations of the lens chamber 38 being able to move independently in the optical axis AX direction (i.e. the Z direction).

When the drive quantities in the Z direction by the three actuators 104b are the same quantity, the lens chamber 103b moves in parallel with the Z direction (i.e., the optical axis AX direction) relative to the outer ring 102b. When the drive quantities in the Z direction by the three actuators 104b are different quantities, the lens chamber 103b tilts around an axis that is parallel with the X axis or an axis that is parallel with the Y axis relative to the outer ring 102b. When the drive quantities in the Z direction by the three actuators 104b are different quantities, it is also possible that the lens chamber 103b will move in the Z direction (i.e., the optical axis AX direction) relative to the outer ring 102b.

Moreover, the split lens barrel 100b is provided with drive quantity measuring sections 105b that are attached to the outer ring 102b and are formed, for example, by encoders. The drive quantity measuring sections 105b are attached to the outer ring 102b at an angle of azimuth of 120° within the XY plane, and measure the amount of movement in the Z direction (i.e., in the optical axis AX direction) of the lens chamber 103b relative to the outer ring 102b at various positions. Three dive quantity measuring sections 105b are placed at positions obtained by spacing each of the three actuators 104b at 60° around the center of the split lens barrel 100b within the XY plane. By employing such a structure, it is possible to control the movement of the lens chamber 103b and, in turn, the movement of the lens element 101b in a closed loop by driving the actuators 104b while referring to the results of measurements made by these drive quantity measuring sections 105b. The split lens barrels 100b, 100d, 100e, 100f, and 100g that are provided with the lens elements 101b, 101d, 101e, 101f, and 101g that are driven respectively by the actuators 104b, 104d, 104e, 104f and 104g serving as drive sources correspond to a portion of the movable devices described in the present invention.

Furthermore, lens elements 101a, 101c, 101h, 101i, 101j, 101k, and 101l that are supported by split lens barrels 100a, 100c, 100h, 100i, 100j, 100k, and 100l from among the plurality of split lens barrel 100a to 100l shown in FIG. 3 are formed by fixed lens elements. For example, The split lens barrel 100c is provided with an outer ring 102c that is connected to split lens barrels 100b and 100d that are positioned above and below (in the Z direction) of the split lens barrel 100c, and a lens chamber 103c that holds the lens element 101c that is attached to the outer ring 102c. In the present embodiment, an example is described of a case in which a piezoelectric element is used for an actuator 104b, however, the structure may also employ a magnetostrictive actuator or a hydrostatic pressure actuator. In addition, the lens elements 101a to 101l may be formed by single lens elements, or may be formed by lens groups formed by combining a plurality of lens elements.

In the projection optical system PL having the above described structure, it is possible to make the attitude (i.e., the position in the optical axis AX direction and the tilt relative to the XY plane) of the lens elements 101b, 101d, 101e, 101f, and 101g able to be changed without the attitude of the lens elements 101a, 101c, 101h, 101i, 101j, 101k, and 100l being changed. By adjusting the attitude of one lens element from among the lens elements of these actuators using a lens controller (not shown) to control the drive quantities of the actuators 104b, 104d, 104e, 104e, 104f, and 104g, or alternatively, by adjusting the attitudes of a plurality of lens elements in reaction with each other, it is possible, for example, to individually correct five rotationally symmetric aberrations and five eccentric aberrations that may be generated by the projection optical system PL. The five rotationally symmetric aberrations referred to here are magnification, distortion (i.e., distortion aberration), coma aberration, image surface curvature aberration, and spherical aberration. The five eccentric aberrations are eccentric distortion (i.e., distortion aberration), eccentric coma aberration, eccentric astigmatic aberration, and eccentric spherical aberration.

Returning to FIG. 1, in the projection optical system PL, a flange 23 inserted from above, taking the optical axis AX direction as the Z direction, and is engaged with the lens barrel base plate 25 that is formed from a cast-metal material and is supported substantially horizontally via anti-vibration units 24 on the step portion 8b of the reaction frame 8. The anti-vibration units 24 are placed at each corner of the lens barrel base plate 25, and have a structure in which air mounts 26, whose internal pressure can be adjusted, and voice coil motors 27 are placed in a straight line on the step portion 8b. In FIG. 1, only the anti-vibration units 24 that are placed in the X direction are shown, and the anti-vibration units that are placed in the Y direction are omitted from the drawing. Minute vibrations that are transmitted to the lens barrel base plate 25 (and in turn to the projection optical system PL) via a base (pedestal) plate 10 and the reaction frame 8 are isolated at a micro G level by the anti vibration units 24.

The stage apparatus 7 is mainly formed by a wafer stage 5, a wafer base plate 6 that supports the wafer stage 5 such that it is able to move two-dimensionally on the XY plane, a sample stage St that is provided integrally with the wafer stage 5 and holds the wafer 5 by suction, and X guide bars XG that support the wafer stage 5 and sample stage XG such that they can move freely relatively to each other. A plurality of air bearings (i.e., air pads) 28, which are non-contact bearings, are fixed to the bottom surface of the wafer stage 5, and the wafer stage 5 is supported by these air bearings 28 so as to float above the wafer base plate 6 via a clearance, for example, of several microns.

The wafer base plate 6 is supported substantially horizontally via anti-vibration units 29 above the base (pedestal) plate 10. The anti-vibration units 29 are placed at each corner of the wafer stage 6, and have a structure in which air mounts 30, whose internal pressure can be adjusted, and voice coil motors 31 are placed in a straight line on the base plate 10. In FIG. 1, only the anti-vibration units 29 that are placed in the X direction are shown, and the anti-vibration units that are placed in the Y direction are omitted from the drawing. Minute vibrations that are transmitted to the was plate 6 via the base plate 10 are isolated at a micro G level by the anti vibration units 29.

Figure 4:
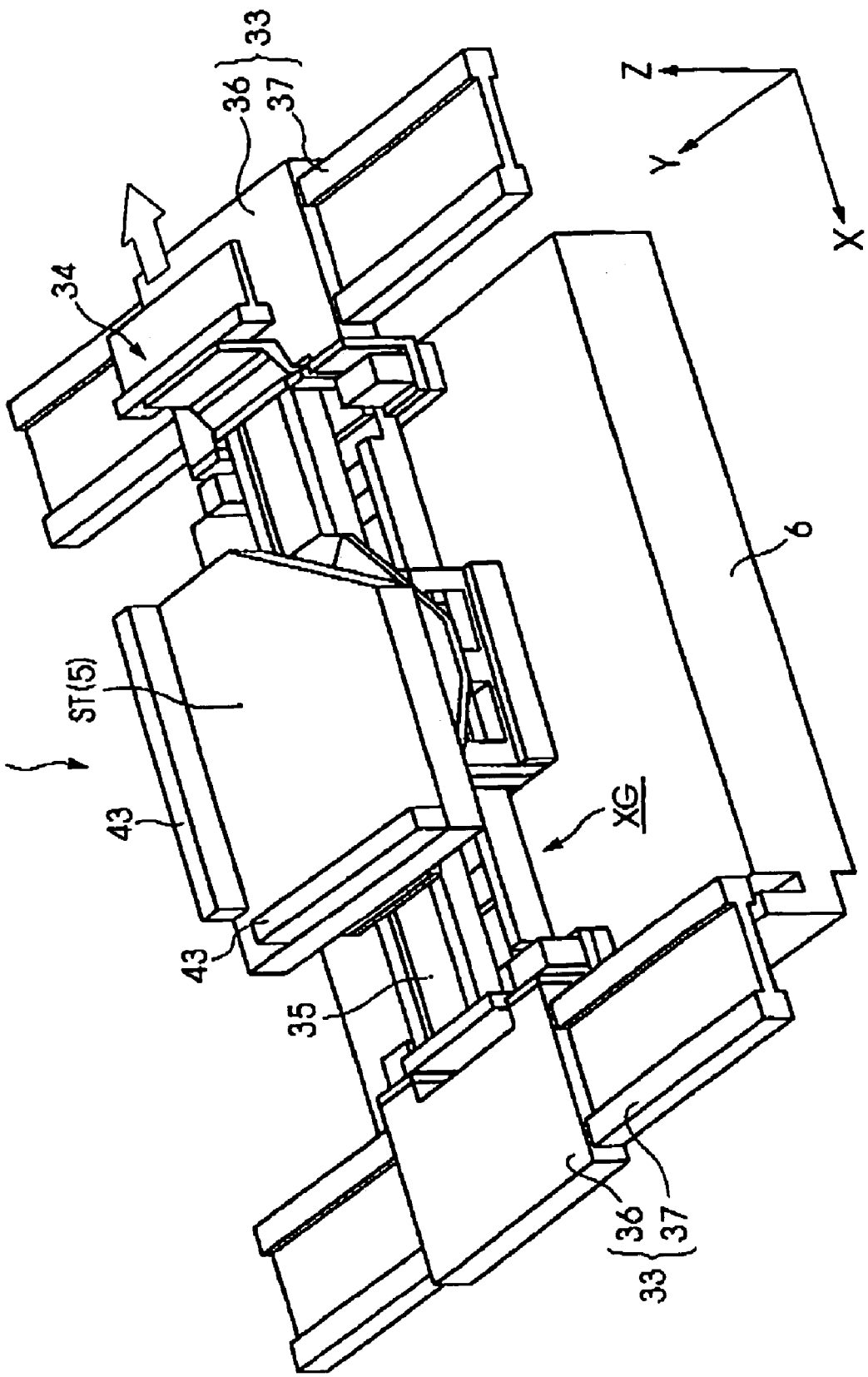
FIG. 4 is an external perspective view of a wafer stage that is provided in the exposure device according to the first embodiment of the present invention.

The wafer stage 5 will now be described in detail. FIG. 4 is an external perspective view of a wafer stage that is provided in the exposure device according to the first embodiment of the present invention. As is shown in FIG. 4, the X guide bars XG present an elongated configuration in the X direction, and movable elements 36 and 36 that are formed by armature units are provided respectively at both ends in the longitudinal direction thereof. Static elements 37 and 37 that have magnetic units to correspond to the movable elements 36 and 36 are provided on supporting portions 32 and 32 that protrude from the pedestal plate 10 (see FIG. 1—to simplify FIG. 1, the movable elements 36 and the static elements 37 have been omitted).

Linear motors (i.e., drive sources) 33 and 33 are formed by the movable elements 36 and the static elements 37. The X guide bar XG is moved in the Y direction as a result of the movable element 36 being driven by an electromagnetic interaction that arises between itself and the static element 37, while the X guide bar XG is rotated in the θZ direction by adjusting the drive of the linear motors 33 and 33. Namely, the wafer stage 5 (and the sample stage ST, hereinafter these will be referred to simply as the sample stage ST) are driven substantially integrally with the X guide bar XG in the Y direction and the θZ direction by the linear motors 33.

A movable element of an X trim motor 34 is attached to the negative X direction side of the X guide bar XG. The X trim motor 34 adjusts the position in the X direction of the X guide bar XG by generating thrust in the X direction, and the fixed element thereof (not shown) is provided on the reaction frame 8. As a result, the reaction force that arises when the wafer stage 5 is driven in the X direction is transmitted to the base plate 10 via the reaction frame 8.

The sample stage ST supports and holds the X guide bar XG without being in contact with the X guide bar XG such that it can perform relative movement freely in the X direction via a magnetic guide, which is composed of a magnet and an actuator, that maintains a predetermined gap in the Z direction between itself and the X guide bar XG. The wafer stage 5 is driven in the X direction by electromagnetic interaction from are X linear motor (i.e., drive source) 35 that has a static element embedded in the X guide bar XG. A movable element of the X linear motor (not shown) is attached to the wafer stage 5. A wafer W is fixed by vacuum suction or the like via a wafer holder 41 to a top surface of the sample stage ST (see FIG. 1). The wafer stage 5 that is driven by the linear motors 33 and 33 and the X linear motor 35, which serve as drive sources, corresponds to a portion of the movable device or control device described in the present invention.

The X linear motor 25 is placed in a position that is closer to a wafer W mounted on the wafer stage 5 than the above described line motors 33, which serve as drive sources. As a result, is preferable that a moving coil type of liner motor that has a low heat output is used for the X linear motor 35. It is also preferable that, from the viewpoint of heat output, in the same way as for the X linear motor 35, a moving coil type of linear motor is used for the linear motors 33. However, because it is necessary in a moving coil type of linear motor for coolant to be circulated to the movable element 36, if this is not possible due to the structure of the apparatus, it is also possible to use a beam magnet type of linear motor in which a magnet is provided on the movable element 36 side.

The position of the wafer stage 5 in the X direction is measured in real time at a predetermined resolution, for example, a resolution of approximately 0.5 to 1 nm, by the laser interferometer 44 shown in FIG. 1 that measures the position change of a moving mirror 43 that is fixed to a portion of the wafer stage 5, taking as a reference a reference mirror 42 (see FIG. 1) that is fixed to a bottom end of the lens barrel of the projection optical system PL. The position in the Y direction of the wafer stage 5 is measured by a reference mirror, laser interferometer, and moving mirror (none of which are shown) that are placed substantially perpendicularly with the aforementioned reference mirror 42, moving mirror 43, and laser interferometer 44. At least one of these laser interferometers is a multi-axis interferometer that has two or more measurement axes, and not only can the positions of the wafer stage 5 (and consequently of the wafer W) in the X direction and Y direction be determined based on measurement values from these laser interferometers, but the θ rotation amount and leveling amount can also be determined.

Furthermore, as is shown in FIG. 1, three laser interferometers 45 (however, in FIG. 1, only one of these laser interferometers is shown as representative of all three) are fixed at three different locations to the flange 23 of the projection optical system PL. Apertures 25a are formed respectively at portions of the lens barrel plate 25 that face each of the laser interferometers 45, and laser beams (i.e., measurement beams) are irradiated in the Z direction towards the base plate 6 from each of the laser interferometers 45 via these apertures 25a. Reflecting surfaces are formed respectively at positions facing each of the measurement beams on the top surface of the wafer base plate 6. As a result, three different Z positions on the wafer base plate 6 are measure respectively by the three laser interferometers 45, taking the flange 23 as a reference.

Figure 5:
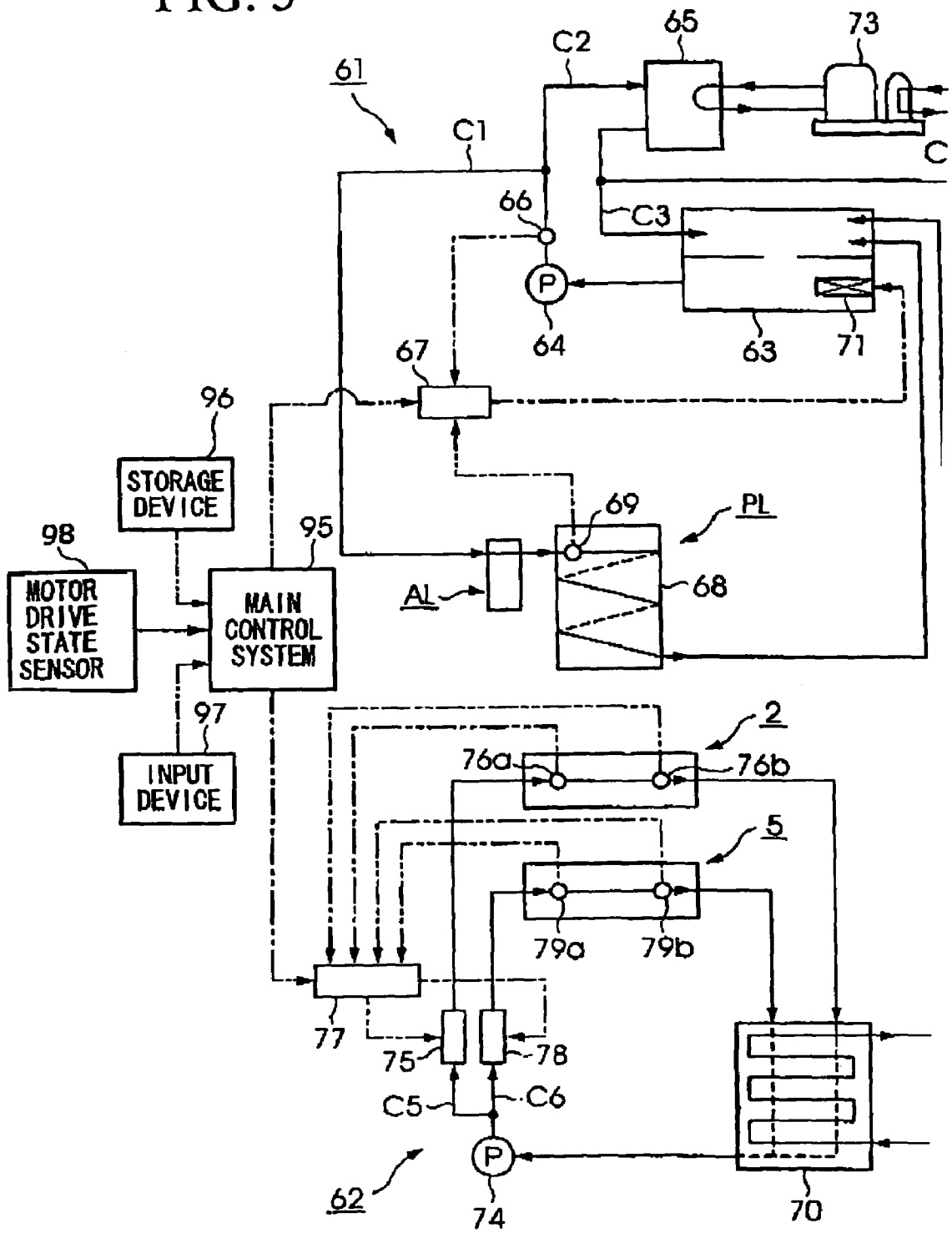
FIG. 5 is a view showing the structure of a temperature control system that is provided in the exposure device according to the first embodiment of the present invention.

Next, a description will be given of the temperature control system that is provided in the exposure device 1. FIG. 5 is a view showing the structure of the temperature control system that is provided in the exposure device according to the first embodiment of the present invention. The temperature control system shown in FIG. 5 can be broadly divided into a first control system 61 that performs temperature control and management using a coolant taking the projection optical system PL and alignment system AL as objects of control, and a second control system 62 that performs temperature control and management using a coolant independently from the first control system 61 taking the reticle stage 2 and the wafer stage 5 as objects of control. The first control system 61 and the second control system 62 are each placed inside separate housings (not shown). In this way, in the present embodiment, the projection optical system PL and the alignment system AL whose heat output and amount of temperature change are within predetermined quantities are controlled separately from the reticle stage 2 and the wafer stage 5 whose heat output and amount of temperature change are greater than predetermined quantities. It is possible to use hydrofluoroether (HFE) or florinate as the coolant used for temperature adjustment, however, in the present embodiment, from the viewpoint of protecting the global environment, HFE, which has a low global warming coefficient and whose ozone damage coefficient is zero, is used.

In the first control system 61, coolant inside a tank 63 that has undergone temperature adjustment passes through a pump 64 and then is split between a circulation system C1 that circulates it sequentially through the alignment system AL and the projection optical system PL, and a cooling system C2 that is cooled by an evaporator 65. The temperature of the coolant immediately after it has been discharged from the pump 64 is detected by a temperature sensor 66, and is then output to a controller 67. Concerning the circulation system C1, the temperature adjustment range using coolant of the projection optical system PL is broadly set as the circulation system C1 is laid in a spiral configuration around a lens 68. In the present embodiment, in FIG. 5, a structure is shown in which the coolant is circulated from top to bottom in a spiral around the lens barrel 68, however, the present embodiment is not limited to this and it is also possible to employ a structure in which the coolant is circulated from bottom to top in a spiral configuration. In this circulation system C1, there is provided a temperature sensor 69 that detects the temperature of the coolant before it is circulated around the projection optical system PL, and a result of this detection is output to the controller 67. The temperature sensor 66 and the temperature sensor 69 correspond to a portion of the detection system described in the present invention. In the present embodiment, as is described above, the temperature of the projection optical system PL is adjusted by placing the circulation system C1 in a spiral configuration around substantially the entire surface of the lens barrel 68, however, the present invention is not limited to this, and it is also possible to perform temperature adjustment by placing the circulation system C1 in a portion of a member (i.e., the flange 23) that holds the projection optical system PL (i.e., a flange a temperature adjustment mode).

For the off-axis type of alignment system AL, a laser step alignment (LSA) type, a field image alignment (FIA) type, or a laser interferometer alignment (LIA) type of alignment sensor can be used. The LSA type is a format in which laser light such as from a He—Ne laser is irradiated onto alignment marks shaped as rows of dots on the wafer W, and the mark positions are detected using light that has been diffracted or scattered by the marks. The FIA type is a format in which the alignment marks are illuminated using light having a broad wavelength bandwidth from a light source such as a halogen lamp, and image data of the alignment marks that has been picked up by a CCD camera or the like undergoes image processing enabling the position of the marks to be measured. Furthermore, the LIA type is a format in which two coherent beams (such as semiconductor lasers) that are tilted symmetrically in the pitch direction are irradiated onto alignment marks in the form of a diffraction grating on the wafer W so that the two diffracted lights that are generated are made to interfere with each other, and the positions of the alignment marks are measured from the phrases thereof. As the alignment sensors it is possible to use a format such as that disclosed for example, in WO 98/39689, namely, a format in which alignment detection light (i.e., He—Ne or YAG laser light or the like) is irradiated perpendicularly onto alignment marks on a wafer, and diffracted light of the same order that is generated from the marks is detected. In the present embodiment, a FIA type of alignment sensor is used from among those described above.

In the above described circulation system C1, temperature adjustment is performed by circulating coolant to an alignment light source within the alignment system AL. As the circulation system, for example, in the same way as the projection optical system PL, it is possible for the circulation system to be placed in a spiral configuration in a housing that contains the light source. In the alignment system AL, it is possible to employ a structure in which temperature control is performed by circulating coolant not only to the alignment light source, but also to a housing that contains the optical system used for the alignment. In addition, not only in an off-axis system, but in the same way also in a through the reticle (TTR) system and a through the lens (TTL) system that detect marks on the wafer W via the projection optical system PL, it is possible to perform temperature adjustment by circulating coolant to the alignment light source and housing. The coolant that is circulated through the alignment system AL and the projection optical system PL in the circulation system C1 is returned to an upper chamber of the tank 63 that is partitioned into upper and lower communicating chambers.

Because TTR system and TTL system alignment sensors measure the positions of alignment marks that are formed on the wafer W via the projection optical system PL, a structure is employed in which these alignment sensors are able to be moved forward or backward relative to an aperture portion in the projection optical system PL on the substance surface (i.e., reticle) side of the projection optical system PL. Accordingly, when these alignment sensors are provided, a motor that is used for moving the alignment forward or backward corresponds to the drive source described in the present invention, and the alignment sensors correspond to the movable device described in the present invention.

In contrast, the coolant in the cooling system C2 is cooled by the evaporator 65 and is then split between a path C3 that returns to the upper side chamber of the tank 63 and a path C4 that heads towards a heat exchanger 70. The evaporator 65 is cooled by a refrigerating machine 73 that circulates a gas coolant. Cooled coolant is used for heat exchange by the heat exchanger 70 on the path C4, and is then returned to the upper side chamber of the tank 63 where it is once again cooled.

A heater 71 that is controlled by the controller 67 is placed in the lower side chamber of the tank 63. As a result of this controller 67 controlling the driving of the heater 71 based on results of detections by the temperature sensors 66 and 69, the temperature of the alignment system AL and the projection optical system PL are controlled (i.e., managed) to, for example, 23° C.±0.01° C. via coolant. The controller 67 forms a portion of the temperature control system (this is described in detail below) described in the present invention, and the temperatures of the alignment system AL and the projection optical system PL are controlled by conducting feedforward control and feedback control.

In the second control system 62, coolant that has been cooled by the heat exchanger 70 passes through a pump 74 and is then split between a circulation system C5 that circulates around the reticle stage 2 and a circulation system C6 that circulates around the wafer stage 5. A structure is employed in which the coolant in the second control system 62 circulates in a closed system and does not return to the tank 63. In the circulation system C5, a heater 75 is provided in a position downstream from the pump 74. In addition, there are provided temperature sensors 76a and 76b that respectively detect the temperature of the coolant before it is circulated to the reticle stage 2 and the temperature of the coolant after it has been circulated to the reticle stage 2. Results of detections by the temperature sensors 76a and 76b are output to a controller 77. The controller 77 takes a simple average or a weighted average of the detection results output from the temperature sensors 76a and 76b, and by perform feedback control of the heater 75 based on the coolant temperature that is thereby obtained, controls (i.e., manages) the temperature of the reticle stage 2 to, for example, 23° C.±0.1° C. In the present embodiment, a structure is employed in which coolant that has been cooled by the heat exchanger 70 is made to circulate to the pump 74, however, if there is considerable pressure loss in the heat exchanger 70, it is possible to employ a structure in which the pump 74 is placed upstream from the heat exchanger 70 and the point where the coolants returning to the circulation systems C5 and C6 (i.e., coolants that have already cooled the various stages) flow together is positioned upstream from the pump 74.

Figure 6:
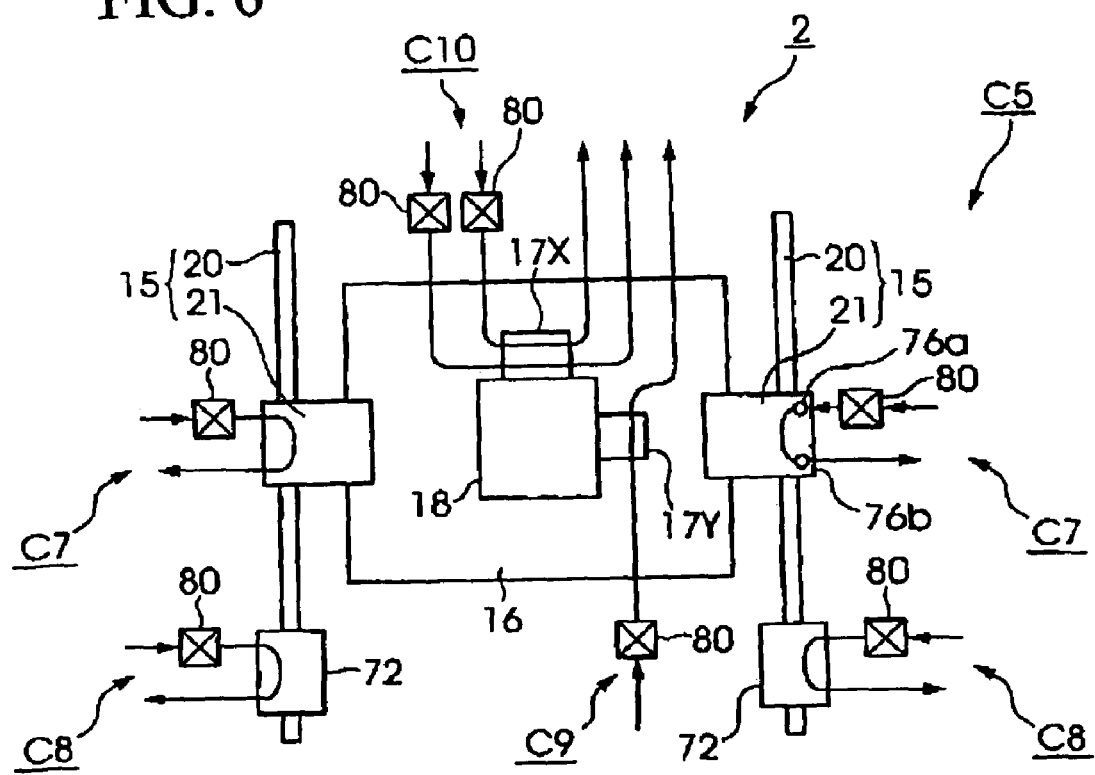
FIG. 6 is a schematic view of a temperature control system that is provided for the reticle stage.

The temperature control system for the reticle stage 2 will now be described in further detail. FIG. 6 is a schematic view of a temperature control system that is provided for a reticle stage. As is shown in FIG. 6, the circulation system C5 is split into a plurality of branch paths made up of circulation systems C7 and C7 that respectively perform temperature control by circulation of movable elements 21 and 21 of the Y linear motor 15, circulation systems C8 and C8 that respectively perform temperature control by circulation of the trim motors 72 and 72, a circulation system C9 that performs temperature control by circulation of the Y voice coil motor 17Y, and a circulation system C10 that performs temperature control by circulation of the X voice coil motor 17X.

A valve 80 that adjusts the flow rate of coolant is positioned respectively upstream from each motor in the respective circulation systems C7 to C10. In addition, in one of the circulation systems C7, in the vicinity of a movable element 21 there are provided the aforementioned temperature sensor 76a that detects the coolant temperature before it is circulated to the movable element 21, and the aforementioned temperature sensor 76b that detects the coolant temperature after it has been circulated to the movable element 21. The temperature sensors 76a and 76b form a portion of the detection section described in the present invention. In the present embodiment, the temperature sensors 76a and 76b are provided representatively for only one movable element 21 (the movable element 21 on the right hand side in FIG. 6), however, the present invention is not limited to this, and it is also possible to provide a temperature sensor respectively for all drive sources that are to become the objects of temperature control.

Returning to FIG. 5, in the circulation system C6, a heater 78 is provided in a position downstream from the pump 74. In addition. there are provided temperature sensors 79a and 79b that respectively detect the temperature of the coolant before it is circulated to the wafer stage 5 and the temperature of the coolant after it has been circulated to the wafer stage 5. Results of detections by the temperature sensors 79a and 79b are output to a controller 77. The temperature sensors 79a and 79b form a portion of the detection section described in the present invention. The controller 77 takes a simple average or a weighted average of the detection results output from the temperature sensors 79a and 79b, and by performing feedback control of the heater 78 based on the coolant temperature that is thereby obtained, controls (i.e., manages) the temperature of the wafer stage 5 to, for example, 23° C.±0.1° C. Coolant that has been circulated around the reticle stage 2 by the circulation system C5 and coolant that has been circulated around the wafer stage 5 by the circulation system C6 are each cooled by the heat exchanger 70, and are then allowed to flow together.

Figure 7:
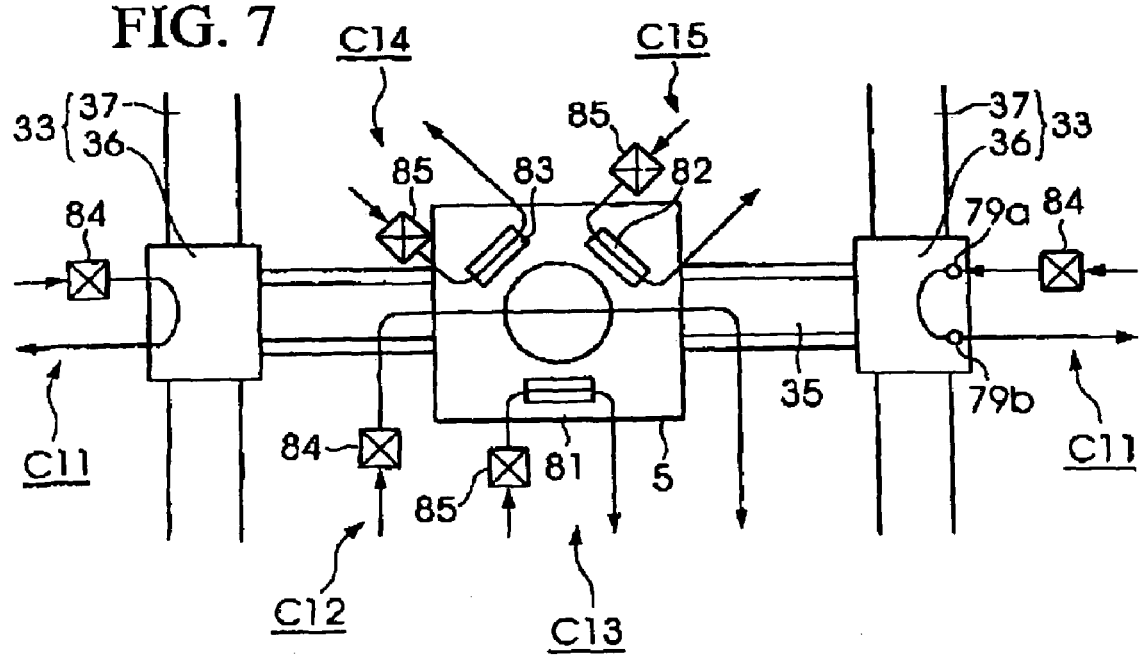
FIG. 7 is a schematic view of a temperature control system that is provided for the wafer stage.

The temperature control system for the wafer stage 5 will now be described in further detail. FIG. 7 is a schematic view of a temperature control system that is provided for a wafer stage. As is shown in FIG. 7, the circulation system C6 is split into circulation systems C11 and C11 that respectively perform temperature control by circulation of movable elements 36 and 36 of the linear motor 33, and a circulation system C12 that performs temperature control by circulation of the X linear motor 35. A valve 84 that adjusts the flow rate of coolant is positioned respectively upstream from each motor in each of the circulation systems C11 and C12. In addition, in one of the circulation systems C11, there are provided the aforementioned temperature sensor 79a that detects the coolant temperature before it is circulated to the movable element 36, and the aforementioned temperature sensor 79b that detects the coolant temperature after it has been circulated to the movable element 36. In the same way as for the above described reticle stage, in the case of temperature sensors provided on the wafer stage 5 side as well, it is also possible to provide a temperature sensor respectively for all drive sources that are to become the objects of temperature control.

Circulation systems C13 to C15 are also provided respectively for the three voice coil motors 81 to 83 that perform leveling adjustment (and focus adjustment) for the wafer stage 5 (i.e., the sample stage ST). Valves 85 that adjust the flow rate of the coolant are also provided respectively at positions upstream from the voice coil motors in each of the circulation systems C13 to C15, however, because the voice coil motors 81 to 83 are driven less frequently than the linear motors 33 and 35, and because the heat output and the amount of temperature change are less when they are driven, the circulation systems C13 to C15 are temperature controlled using coolant that has been diverted from the circulation system C1 of the first control system 61.

Returning once more to FIG. 5, a main control system 95 controls the overall operations of the exposure device 1 by outputting control signals (i.e., control commands) to each section that is provided within the exposure device 1 based on the contents of exposure data files that are stored, for example, in a storage apparatus 96 such as a hard disk or the like. In the exposure data files are stored the shot member that is set for the wafer W and information to the reticle R that is used, as well as processing that is required for the exposure of the wafer W (i.e., illumination distribution adjustment processing, alignment processing, processing to adjust the optical characteristics of the projection optical system PL, and temperature control processing and the like), and also the processing sequence of these (what is known as the recipe).

When the main control system 95 performs processing to relatively much the positions of the reticle R and the wafer W (i.e., alignment processing), based on the contents of the above described exposure data files, an alignment control signal (i.e., a first control command) is output to a stage controller (not shown) and the alignment system AL and the positions of the reticle stage 2 and wafer stage 5 are adjusted, and alignment is conducted by the alignment system AL measuring alignment marks that are formed on the reticle R and alignment marks that are formed on the wafer W.

When transferring a pattern on the reticle R onto the wafer W, an exposure control signal (i.e., a second control command) is output to the stage controller (not shown) and the illumination optical system IU based on the contents of the above described exposure data files, so that the reticle stage 2 and the wafer stage 5 are accelerated. When the reticle stage 2 and the wafer stage 5 have each reached a preset acceleration, illumination light is irradiated from the illumination optical system IU and, in a state in which a portion of the reticle R is illuminated by this illumination light, the reticle stage 2 and the wafer stage 5 are scanned.

When the exposure device 1 is performing an operation, there are cases when an unforeseen state (i.e., an abnormal state) arises, and it is not possible for processing to proceed in the processing sequence that is defined in the exposure data files. For example, a case may arise in which the alignment marks of the wafer W are not measured during the above described alignment processing, so that processing subsequent thereto cannot be performed. When an abnormal state such as this arises, the main control system 95 outputs a return (reset) control signal (i.e., a third control command) to each section of the exposure device 1, and performs processing to return (reset) from the abnormal state to a normal state. This return (reset) processing may involve, for example, moving the reticle stage 2 and the wafer stage 5 to preset points of origin, and, if illumination light is being irradiated from the illumination optical system IU, performing processing to stop the illumination of this illumination light.

As is shown in FIG. 5, a control signal CS1 (i.e., containing the aforementioned alignment control signal, exposure control signal, and return (reset) control signal) that is output from the main control system 95 is output to the controller 67 and the controller 77. This is because the controllers 67 and 77 control the temperatures of the projection optical system PL and alignment system AL as well as of the reticle stage 2 and the wafer stage 5 using feedforward control in accordance with the control signal CS1 from the main control system 95.

In the first control system 61, the exposure device 1 of the present embodiment sets the temperature of coolant that is circulating around the alignment system AL and the projection optical system PL using the heater 71 that is provided inside the tank 63, and in the second control system 62 sets the temperature of coolant that is circulating through the reticle stage 2 and the wafer stage 5 respectively using the heaters 75 and 78. In order to keep the temperatures of the alignment system AL and projection optical system PL and of the reticle stage 2 and wafer stage 5 constant with a high degree of accuracy, it is preferable that time wasted due to control (for example, the time taken for coolant whose temperature has finally been adjusted by the heaters 75 and 78 to pass through the pipes (i.e., the flow paths) and arrive at an object to be cooled such as a motor, and actually adjust the temperature thereof) is extremely short.

However, due to the structure of the exposure device 1, it is difficult to place the heater 71 close to the alignment system AL and the projection optical system PL that are the objects of its control, and place the heaters 75 and 78 respectively close to the reticle stage 2 and the wafer stage 5 that are the objects of their control, and a certain amount of time wastage is incurred. In the present embodiment, as is described below, a deterioration in the accuracy of the temperature control due to time wastage is prevented by the controllers 67 and 77 setting the temperatures of the respective coolants using feedforward control based on the control signals CS1 output from the main control system 95.

It is preferable that sensors that are accurate enough to be able to detect ±0.01° C. are used for the temperature sensors 66 and 69 that are provided in the first control system 61, for the temperature sensors 76a and 76b that are provided in the reticle stage 2, and for the temperature sensors 79a and 79b that are provided in the wafer stage 5. However, because a temperature control accuracy of ±0.1° C. is required for the reticle stage 2 and the wafer stage 5, for the temperature sensors 76a, 76b, 79a, and 79b, it is possible to use temperature sensors having the detection capability required in order to achieve this temperature control accuracy. Furthermore, it is desirable that the sampling cycle of the temperature measurement by the temperature sensors is altered in accordance with the required temperature control accuracy or with the amount of temperature change in the projection optical system PL, the reticle stage 2, and the wafer stage 5 that are being controlled such as, for example, by shortening the sampling cycle when a high level of control accuracy is required or when there is a large amount of change in the temperature.

Moreover, in the present embodiment, each temperature sensor is placed inside a flow passage (i.e., a pipe) so that it is able to directly measure the coolant temperature, however, in addition to this, it is also possible to employ a structure in which the detection portion of the temperature sensor is placed in a position away from the wall surface of the pipe (namely, in a position where it is suspended in the vicinity of the center of the pipe interior). By placing the temperature sensor in this position, the advantage is gained that it is difficult for the temperature sensor to be adversely affected by the outside environment via the pipe wall surface. It is also possible to use a structure in which the temperature sensor can be replaced. For this structure it is possible to employ a structure in which an insertion aperture is provided in the pipe and the temperature sensor can be replaced via this insertion aperture, or a structure in which the temperature sensor is fixed to the pipe by welding or the like, and the portion of the pipe that contains the temperature sensor can be replaced. Furthermore, it is possible to employ a structure in which the temperature sensor is placed on the external surface of the pipe, and the coolant temperature is measured via the pipe.

Figure 8:
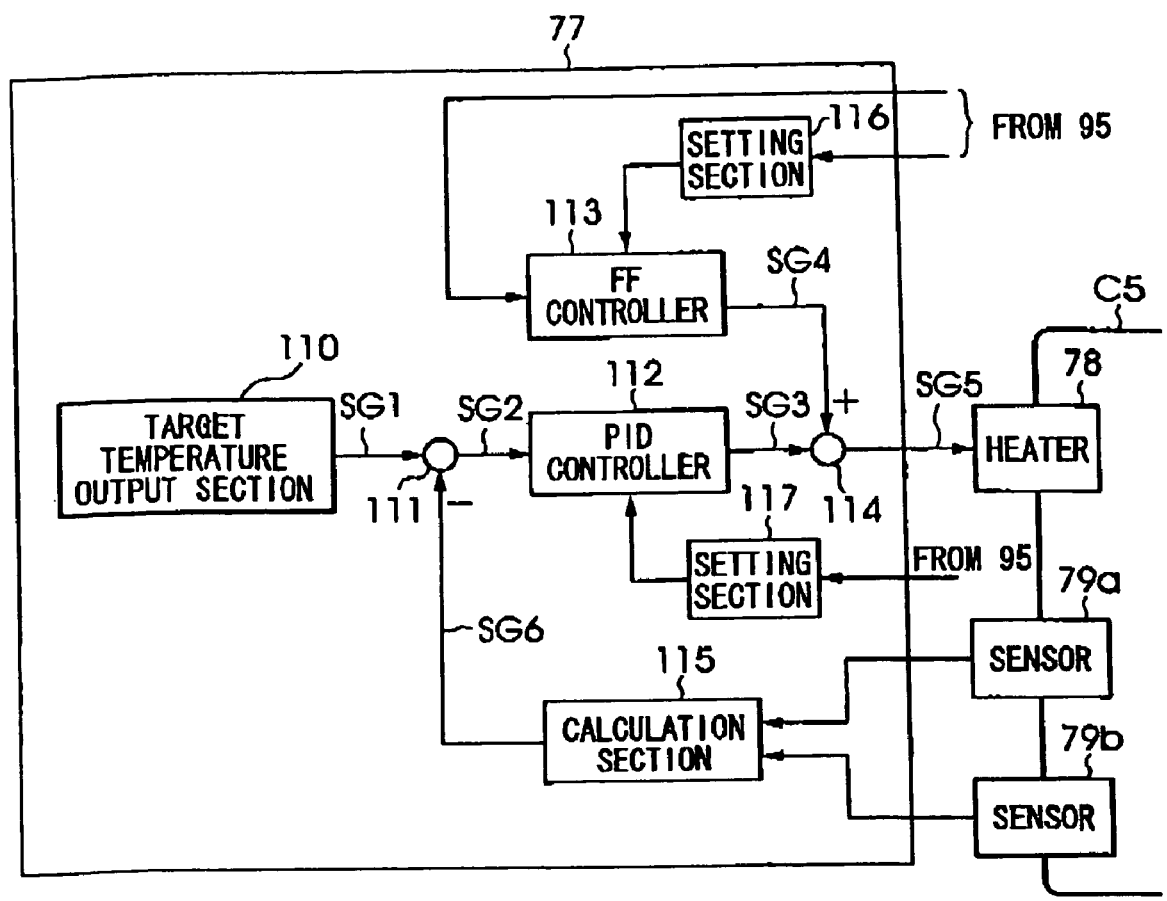
FIG. 8 is a block diagram showing the structure of portions of a controller 77 that controls the temperature of a wafer stage 5.

Next, the structures of the controllers 67 and 77 will be described in detail. FIG. 8 is a block diagram showing the structure of portions of the controller 77 that control the temperature of the wafer stage 5. Because the portions that control the temperature of the reticle stage 2 have the same structures, they are not shown in FIG. 8. In addition, the structure of the controller 67 is the same as the structure of the controller 77 shown in FIG. 8.

Namely, in FIG. 8, if the heater 78, the temperature sensor 79a, and the temperature sensor 79b are replaced respectively with the heater 75, the temperature sensor 76a, and the temperature sensor 76b, then the structure of the portions of the controller 77 that control the temperature of the reticle stage 2 can be described. In FIG. 8, if the controller 77, the heater 78, the temperature sensor 79a, and the temperature sensor 79b are replaced respectively with the heater 71, the temperature sensor 66, and the temperature senor 69, then the structure of the controller 67 can be described order to avoid duplication in the description below, only the structure of the portions of the controller 77 that control the temperature of the wafer stage 5 are described. In FIG. 8, the wafer stage 5 is not shown.

As is shown in FIG. 8, the portion of the controller 77 that controls the temperature of the wafer stage 5 is constructed so as to include a target temperature output section 110, a calculation section 111, a proportional integral derivative (PID) controller 112, a feedforward (hereinafter, referred to as FF) controller 113, an adding device 114, a calculation section 115, a setting section 116, and a setting section 117. The target temperature output section 110 outputs a target temperature signal that supplies the target temperature (for example, 23° C.) of the wafer stage 5. The calculation of calculation section 51 outputs target temperature signals SG1 that are output from the target temperature output section 110, and deviation signals SG2 that correspond to the difference with the return signals SG6 that are output from the operation section 115.

The PID controller 112 outputs control signals SG3 for controlling the heating amount of the heater 78 based on input deviation signals SG2. The FF controller 113 outputs control signals SG4 for controlling the heating amount of the heater 78 based on control signals CS1 that are output from the main control system 95, and performs feedforward control of the temperature of the coolant of the circulation system C5, and consequently of the temperature of the wafer stage 5.

The acceleration and deceleration frequency (i.e., the drive frequency) and the quantity of the acceleration (i.e., the driving amount) of the wafer stage 5 per unit time are different respectively when the main control system 95 is performing processing to match the relative positions of the reticle R and the wafer W, when the main control system 95 is performing processing to scan the reticle stage 2 and the wafer stage 5 so as to transfer a pattern on the reticle R onto the wafer W, and when the main control system 95 is performing return (reset) processing. Therefore, the FF controller 113 calculates the acceleration and deceleration frequency and the quantity of the acceleration per unit time from control signals SC1 that are output from the main control system 95, and outputs control signals SG4 whose control quantity (amount) can be changed for each of these processings.

The reason why feedforward control is performed using the FF controller 113 is in order to control the temperature of the wafer stage 5 with a high degree of accuracy, for example, to control it to (i.e. to maintain it at) 23° C.±0.1° C. The adding device 114 adds the control signals SG3 output from the PID controller to the control signals SG4 output from the FF controller 113, and outputs the result as a control signal SG5 to the heater 78. The calculation section 115 performs predetermined calculation processing (for example, averaging processing) on detection results from the temperature sensors 79a and 79b, and outputs the result as a signal SG6. In this way, the controller 77 performs temperature control of the wafer stage 5 using both feedback control and feedforward control.

The setting sections 116 and 117 respectively set a control amount in the FF controller 113 and a control amount in the PID controller 112. In the present embodiment, as is described above, in order to prevent a deterioration in the accuracy of the temperature control that is caused by time wastage due to control, the controller 77 is provided with the FF controller 113 and positively conducts forward control, however, the length of the pipe from the heater 78 shown in FIG. 5 to the wafer stage 5, which is the object of control, may change in accordance with the environment in which the exposure device 1 is installed.

When feedforward control is being performed, the appropriate control amount changes in accordance with the pipe length. In addition the appropriate control amount also changes in accordance with the flow velocity and flow rate (flow amount per unit time) of coolant that is flowing inside the pipes. This is the same for the control amount of the PID controller 113. After the pipe laying has been completed when the exposure device 1 is being installed, it is possible to set the control amount by trial and error as the coolant is being circulated while the exposure device 1 is in actual operation, however, considerable time and effort is required in order to determine the appropriate control amount. Therefore, in the present embodiment, a structure is employed in which simply by inputting the pipe length and pipe diameter from the heater 78 to the wafer stage 5, as well as the flow rate and flow velocity of the coolant that is flowing inside the pipes, the setting sections 116 and 117 are able to calculate and set appropriate control amounts respectively for the FF controller 113 and the PID controller 112. Because the flow velocity of a fluid flowing through a pipe can be calculated based on the flow amount (flow rate which flow amount per unit time) of that fluid and on the pipe diameter, in the present embodiment, as sets of parameters that are input, when the flow velocity is being input, it is input together with the pipe length as one set of input parameters, while when the flow rate is being input, it is input together with the pipe diameter and pipe length as one set of input parameters.

In FIG. 5, the input device 97 corresponds to the input device described in the present invention and may be formed, for example, by an operation panel or a keyboard or the like. When the exposure device 1 is being installed, the input device 97 is operated by an operator and information relating to the pipe length from the heater 78 to the wafer stage 5 (i.e., the length of the path of the fluid from the location where the fluid receives its last temperature control to the location where it reaches the control object) as well as information relating to the flow rate and flow velocity of coolant that is flowing inside the pipe is input. These groups of information that have been input via the input device 97 are input into the setting sections (i.e., the setting device) 116 of the controller 77 via the main control system 95.

Figure 9:
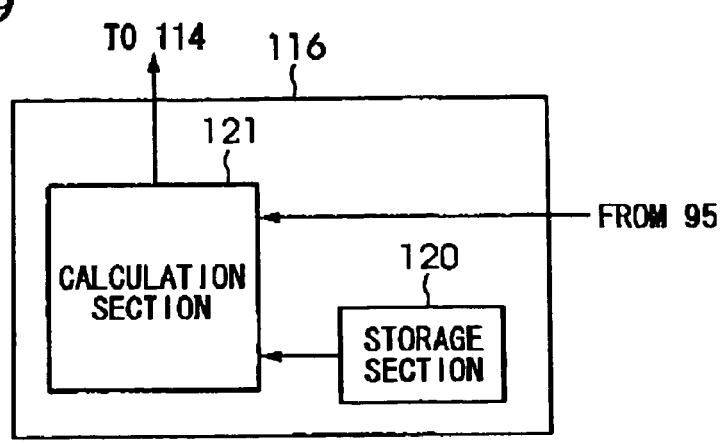
FIG. 9 is a view showing an outline of the internal structure of a setting section 116.

FIG. 9 is a view schematically showing the internal structure of the setting section 116. Because the internal structure of the setting section 117 is the same as the internal structure of the setting section 116, a description of the setting section 117 is omitted other than where such a description is necessary. As is shown in FIG. 9, the setting section 116 is structured so as to include a storage section 120 and a calculation section 121. The storage section 120 stores a reference control amount (i.e., reference control characteristics) for the FF controller 113 when the above described pipe length and pipe diameter are set to a predetermined length (i.e., a reference pipe length) and a predetermined diameter (i.e., a reference pipe diameter), and when the flow rate and flow velocity of the coolant are set to predetermined values (i.e., a reference flow rate and the reference flow velocity).

The calculation section 121 calculates a suitable control amount (i.e., control characteristics) to be set in the FF controller 113 based on the reference control amount that is stored in the storage section 120 and on information such as the pipe length and the like that is input via the input device 97. In this suitable control amount that is calculated by the calculation section 121 are included absolute values (i.e., control constants) of the timing at which the temperature of the coolant that is circulating through the circulation system C5 is controlled and the control amount thereof. In addition, the calculation section that is provided in the setting section 117 calculates the control timing as well as suitable values for each of the control constants of the P (i.e., proportion) control, the I (integration) control, and the D (differential) control for performing PID control.

A simple specific example will now be given. When the flow rate and flow velocity of the coolant that is circulating through the circulation system C5 are identical respectively with the above described reference flow rate and reference flow velocity, and the pipe length is twice the above described reference pipe length, the timing at which the FF controller 113 performs feedforward control is delayed by a factor of twice the timing when the pipe length is equal to the reference pipe length. Accordingly, when the input pipe length is different from the reference pipe length, the calculation section 121 calculates a suitable timing for the feedforward control by linear interpolation of the reference control amount to correspond to the input pipe length.

When the calculation section 121 is calculating the optimum control amount, other than the aforementioned linear interpolation method, it is also possible to use approximation based on the least-squares method, or a complex optional approximation method, or interpolation method. The setting section 116 sets the control amount (i.e., the control characteristics) that has been calculated by the calculation section 121 in the FF controller 113. By employing this structure, it is possible to considerably shorten the time needed for adjustment when installing the exposure device 1, and to achieve a reduction in costs. In addition, it is possible to maintain an expected performance by stabilizing the performance of the exposure device, and as a result it is possible to improve the device manufacturing efficiency.

In the present embodiment, a structure is employed in which the control amount of the feedforward control and the control amount of the PID control are determined by calculation using the reference control amount, as is described above, however, it is also possible to provide tables in which are stored corresponding relationships between respective control amounts and a plurality of setting conditions (i.e., pipe length and flow rate or flow velocity) that have been determined advance using simulations and experiments by subdividing the setting conditions. The optimum control amount for the set conditions can then be selected based on these tables, or else an interpolation calculation can be performed.

A description of the structure of the exposure device according to the first embodiment of the present invention has been given above, and a description of the operation when this exposure device is making an exposure will now be given. This exposure operation is started by the main control system 95 reading data relating to exposure from an exposure data file that is stored in the storage apparatus 96 that is shown in FIG. 5, and outputting exposure control signals (i.e., second control commands) to a stage controller (not shown) and the illumination optical system IU. When the exposure operation has started, the stage controller (not shown) accelerates the reticle stage 2 and the wafer stage 5. When the reticle stage 2 and wafer stage 5 have reached a predetermined speed, the illumination optical system IU irradiates illumination light, and illuminates a predetermined rectangular shaped illumination area on the reticle R at a uniform illumination intensity.

In synchronization with the scanning of the illumination area of the reticle R in the Y direction, an exposure area of the wafer W that is optically combined with this exposure area relative to the projection optical system PL is scanned. As a result, illumination light that has passed through the pattern area on the reticle R is reduced by a magnification of $1/\alpha$ by the projection optical system PL, and a reduction image of the pattern is projected onto the wafer W on which resist has been coated. The pattern on the reticle is successively transferred onto the exposure area on the wafer, and the entire surface of the pattern area on the reticle R is transferred onto the shot area on the wafer W in a single scan.

As a result of the static element 20 moving in the negative Y direction when the reticle coarse movement stage 16 moves, for example, in the positive Y direction, momentum is conserved, and the reaction force that accompanies the movement of the reticle coarse movement stage 16 can be cancelled out, and changes in the position of the center of gravity can be prevented. In addition, as a result of the trim motor 72 being operated at this time, the static element 20 can be forced to arrive at a predetermined position while resisting the coupling of the movable element 21 and the static element 20.

In this exposure processing series, heat is generated in the projection optical system PL by the illumination light (i.e., heat is absorbed by the projection optical system PL), and heat is generated in the alignment system AL by the alignment light (i.e., heat is absorbed by the optical system of the alignment system AL). In addition heat is generated from the respective motors as a result of the driving of the reticle stage 2 and the wafer stage 5. In the first control system 61, as a result of the controller 67 controlling the driving of the heater 71 by performing feedforward control based on control signals SC1 that are output from the main control system 95 and performing feedback control based on results of detections by the temperature sensors 66 and 69, it is possible to control the temperatures of the projection optical system PL and the alignment system AL to a range of ±0.01° C. Moreover, in the second control system 62, as a result of the controller 77 controlling the driving of the heaters 75 and 78 by performing feedforward control based on exposure control signals and performing feedback control based on results of detections by the temperature sensors 76a, 76b, 79a and 79b, it is possible to control the temperatures of the reticle stage 2 and the wafer stage 5 to a range of ±0.1° C.

Figure 10A:
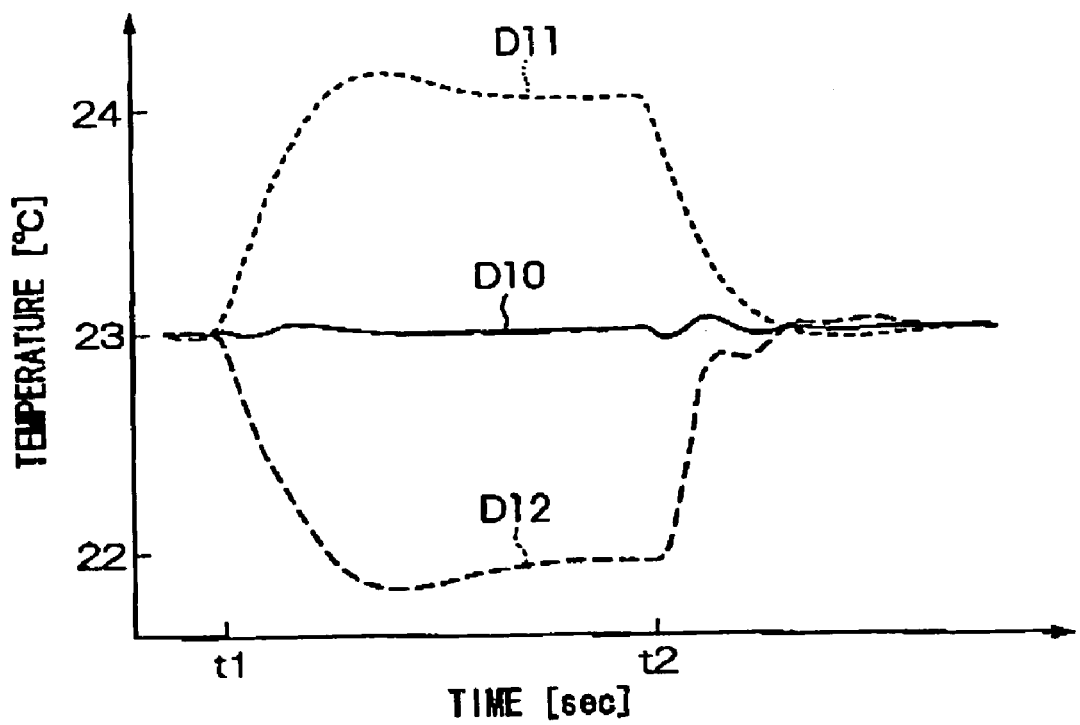
FIGS. 10A and 10B are typical views showing an example of changes in temperature of a coolant that circulates through the wafer stage 5.
Figure 10B:
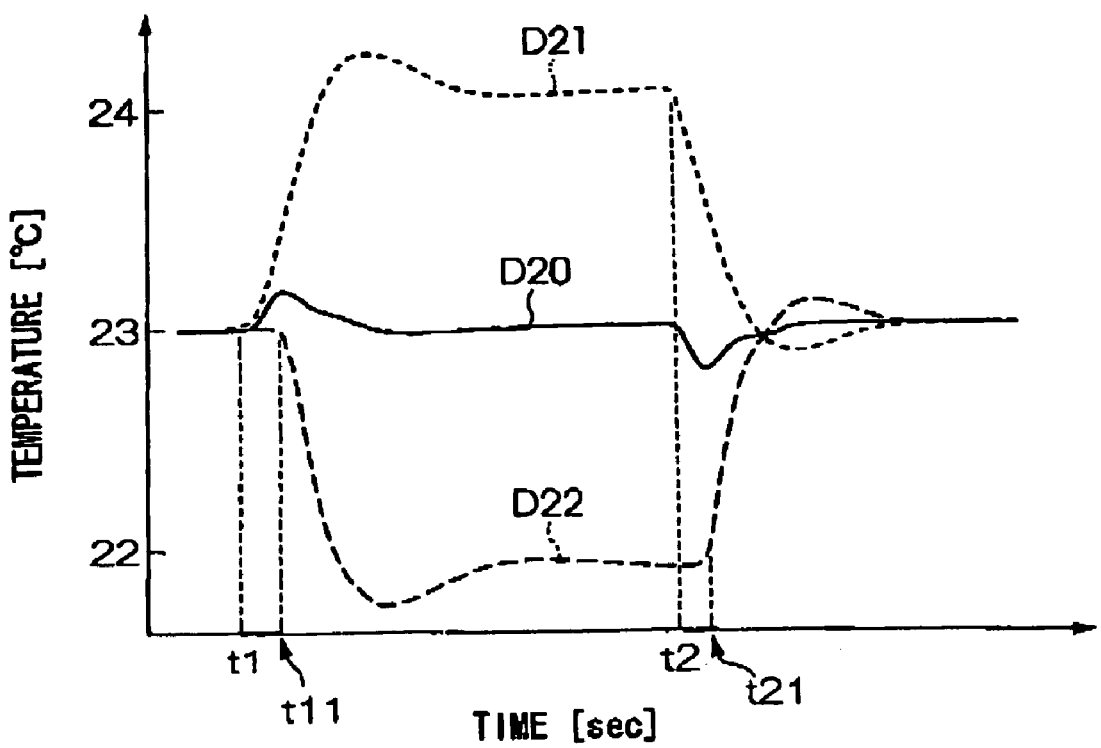

For the reticle stage 2, the controller 77 takes an average calculation of the coolant temperatures detected by the temperature sensors 76a and 76b, and manages and makes adjustments to the driving of the heater 75 based on the coolant temperature that is thus obtained. In the same way, for the wafer stage 5, the controller 77 takes an average calculation of the coolant temperatures detected by the temperature sensors 79a and 79b, and manages and makes adjustments to the driving of the heater 78 based on the coolant temperature that is thus obtained. Here, as an example, a description will be given of coolant temperatures adjusted and managed by the controller 77. FIG. 10A and FIG. 10B are typical views showing examples of temperature changes in a coolant that is circulating around the wafer stage 5. FIG. 10A shows temperature changes when the heater 78 is driven using feedforward control and feedback control, while FIG. 10B shows temperature changes when the heater 78 is driven using only feedback control.

In FIG. 10A and FIG. 10B, the curved lines indicated by the symbols D11 and D21 show results of detections by the temperature sensor 79b that detects the temperature of coolant after it has circulated around the wafer stage 5, while the curved lines indicated by the symbols D12 and D22 show results of detections by the temperature sensor 79a that detects the temperature of coolant before it circulates around the wafer stage 5. Moreover, the curved lines indicated by the symbols D10 and D20 show values obtained by averaging the detection results from the temperature sensor 79a and the detection results from the temperature sensor 79b. The time t1 in FIG. 10A and FIG. 10B is the time when the motors provided in the wafer stage 2 (i.e., the linear 33 and the X linear motor 35) are driven, while the time t2 is the time when the driving of these motors is stopped. The period from the time t1 until the time t2 is the approximate time interval required to expose one lot of wafers W (i.e., a predetermined number of sheets, for example, one lot may equal 25 sheets).

Firstly, in a conventional method for performing temperature control using feedback control, as is shown in FIG. 10B, during the period from when the motor is driven at the time t1 until the time t11, in spite of the fact that a detection result D21 from the temperature sensor 79b that detects the temperature of the coolant after it has circulated around the wafer stage 5 has begun to rise, there is substantially no change in the temperature D22 of the temperature sensor 79a. The reason for this is that, even if the controller 77 drives the heater 78 using feedback control based on detection results from the temperature sensor 79b, it takes time for the coolant to arrive at the wafer stage 5 from the heater 78 shown in FIG. 5, so that what is known as "time wastage due to control is generated.

Accordingly, during the period from the time t1 until the time t11, the average value D20 of the detection results from the temperature sensor 79a and the detection results from the temperature sensor 79b continues to rise, and only begins to fall once it has passed the time t11. As a result, the difference between the average value D20 and the target temperature (23° C. in the example shown in FIG. 10) increases, which is not desirable from the point of view of temperature control. This condition also arises in the same way in the vicinity of the time t2 when operations of the motors are stopped. When operations of the motors are stopped, in spite of the fact that the heat output from the motors is reduced, because the coolant before it circulates around the wafer stage 5 is in a low temperature state, the average value D20 conversely ends up being lower than the target temperature.

Figure 11:
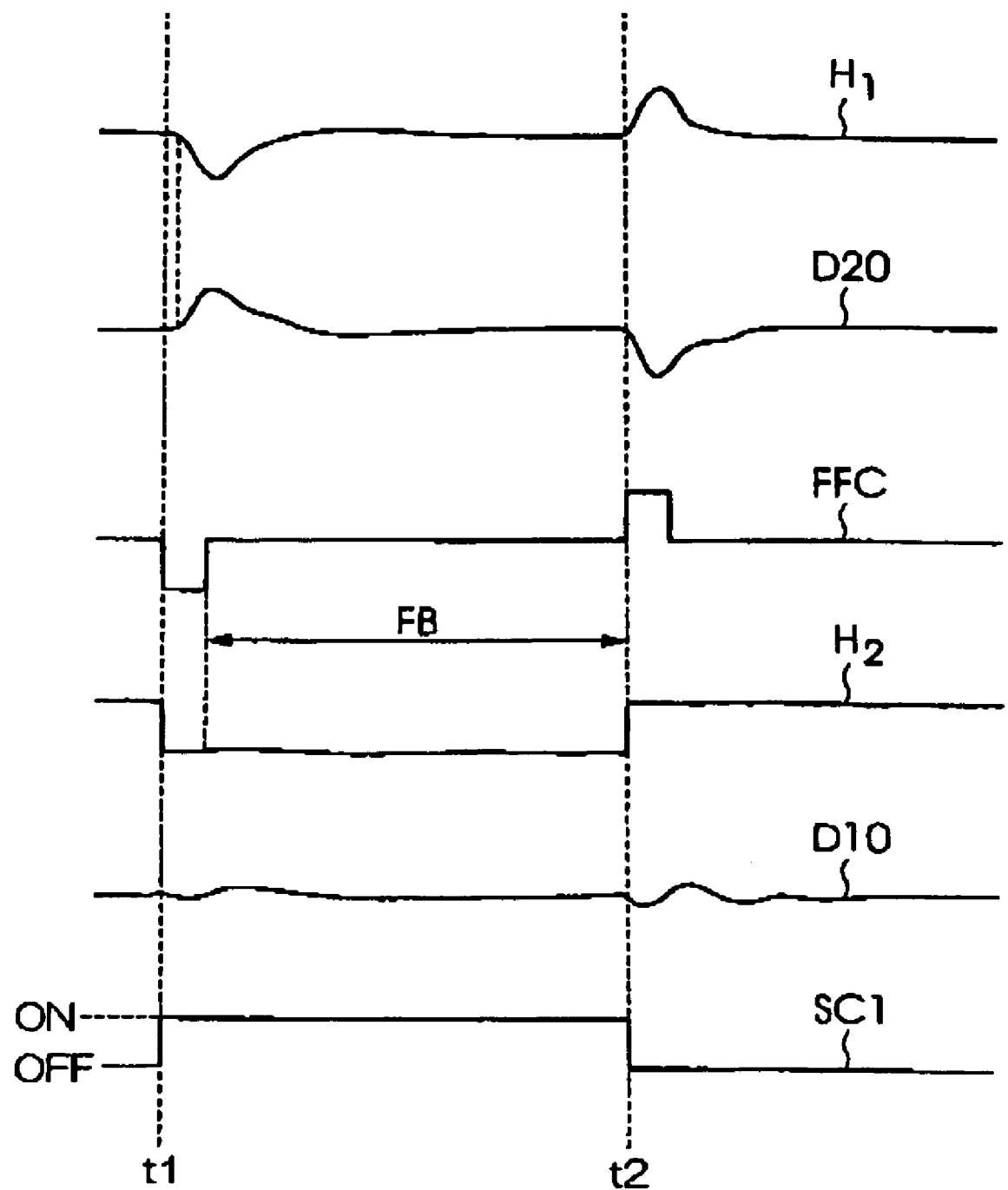
FIG. 11 is a typical view showing an example of feedforward control.

In contrast to this, in the present embodiment in which temperature control is performed using feedforward control and feedback control, feedforward control is performed based on the control signals SC1 that are output from the main control system 95. FIG. 11 is a typical view showing an example of feedforward control. In FIG. 11, the symbol FFC indicates a feedforward component (in the present embodiment, a component that is used to change the output from a heater) that is carried out by the controller 77.

The symbol $H_1$ in FIG. 11 shows the output from a heater when feedback control is performed (i.e., when feed control is not used). The symbol $H_2$ shows the output from a heater when the feedforward component FFC is added to the output $H_1$ (i.e., the output from the heater when feedforward control is used). As is shown in FIG. 11, in the output $H_1$, a delay is generated from when the control signal SC1 switches to ON until when control is performed to lower the heater output.

In contrast to this, when feedforward control is performed, as is shown in FIG. 11, the feedforward component FFC is changed at the point in time when the motor switch between ON (i.e. an opting state) and OFF (i.e., a non-operating state) by the control signal SC1. Namely, in the vicinity of the time t1 when operations of the motors are connected, feedforward control is performed to rapidly lower the temperature of the coolant. Conversely, in the vicinity of the time t2 when operations of the motors are stopped, feedforward control is performed to rapidly raise the temperature of the coolant. As a result, the output $H_2$ of the heater can be seen to fall and rise in synchronization with the ON and OFF of the control signal SC1.

As a result of the above described feedforward control being performed, as is shown in FIG. 10A, the detection result of the temperature sensor 79a that detects the temperature of the coolant before it circulates around the wafer stage 5 falls to match the rise of the detection result D11 of the temperature sensor 79b that detects the temperature of the coolant after it has circulated around the wafer stage 5. Moreover, at the time t2 when operations of the motors are stopped, the detection result from the temperature sensor 79a rises to match the drop in the detection result D11 from the temperature sensor 79b. As a result of this, it can be seen that the average value D10 of the detection result from the temperature sensor 79a and the detection result from the temperature sensor 79b is only slightly removed from the target temperature, and temperature control can be achieved with a high degree of accuracy. Feedback control is performed in the interval between the vicinity of the time t1 and the vicinity of the time t2 (i.e., in FIG. 11, the interval shown by the symbol FB).

The above is a description of an operation of the exposure device when exposure processing is being performed, however, when the reticle R is being positioned relatively to the wafer W, namely, when alignment processing is being performed, based on the control signals CS1 (i.e., the alignment control signals) that are output from the main control system 95, the controller 67 keeps the alignment system AL at a constant temperature by controlling the driving of the heater 71 using feedforward control and feedback control. As a result, it is possible to suppress temperature changes that are caused by heat generated from the light source provided in the alignment system AL or temperature changes that are caused by movement of the alignment sensors forwards and backwards relative to the aperture portion on the substance surface side of the projection optical system PL.

Moreover, when adjusting the best focus position, or adjusting the optical characteristics of the aberration or the like of the projection optical system shown in FIG. 3, a control signal is output from the main control system 95 to a lens controller (not shown), and the lens controller controls the driving amount of the actuators 104b, 104d, 104e, 104f, and 104g, thereby adjusting the attitudes of the lens elements 101b, 101d, 101e, 101f, and 104g. The control signals that are output to the lens controller (not shown) from the main control system 95 are output to the controller 67. Based on these control signals the controller 67 controls the driving of the heater 71 using feedforward control and feedback control, and maintains the projection optical system PL at a constant temperature. As a result, it is possible to suppress changes in temperature of the projection optical system PL that are caused by heat that is generated by the driving of the actuators 104b, 104d, 104e, 104f, and 104g.

Furthermore, if an abnormal state arises while the exposure device 1 is being operated, the main control system 95 outputs a return control signal to each section of the exposure device 1, and performs processing so that the exposure device 1 is returned from the abnormal state to a normal state. Because movable members that are provided inside the exposure device 1 such as the reticle stage 2 and the wafer stage 5 are also driven when this return processing is performed, the controllers 67 and 77 control the driving of each of the heater 71 and the heaters 75 and 78 using feedforward control based on the return control signal and thereby perform control to suppress changes in temperature inside the exposure device 1.

When the above described exposure processing, alignment processing, projection optical system PL temperature control processing, and return processing are being performed, the heat outputs of the movable members provided inside the exposure device 1 such as the reticle stage 2, the wafer stage 5, and the lens elements 101b, 101d, 101e, 101f, and 101g are respectively different for each processing. In particular, for the reticle stage 2 and the wafer stage 5, the driving quantity and driving frequency of the motors are completely different for each of the processing, and the heat output varies considerably in each processing. For example, in the case of exposure processing, acceleration and deceleration are repeated in short steps and, in order to improve throughput, the maximum value of the rate of acceleration is set to a large value, however, in alignment processing, when the relative positions of the reticle stage 2 and wafer stage 5 are being roughly matched, acceleration and deceleration are only performed once (or a few times at most), and neither is the maximum acceleration set to a particularly large value.

Therefore, control tables, which show control amounts for feedback control and control amounts for feedforward control that are set in advance in accordance with the type (i.e., the contents) of the control signals that are output from the main control system 95, are stored respectively in the FF controller 113 and the PID controller 112. The controllers 67 and 77 select a control amount from the control tables in accordance with the type of control signal, and control the driving of each of the heater 71 and the heaters 75 and 78 while enabling the control amount of the feedforward control and the control amount of the feedback control to be varied.

The above is a description of the operation of the exposure device of the present invention. Next, a brief description will be given of the method of setting control timings and control constants of the PID controller 112 and the FF controller 113 that are provided in the controllers 67 and 77. These settings are made as part of the overall adjustments that are made after a variety of subsystems that include each of the component elements of the exposure device 1 have been assembled, and each of this variety of subsystems has been further assembled so as to form the optical apparatus 1 shown in FIG. 1 (i.e., after the exposure device 1 has been installed), with a predetermined mechanical accuracy, electrical accuracy, and optical accuracy being maintained.

In order to ensure each of these different accuracies, before and after the assemblies, adjustment to achieve optical accuracy for each of the optical systems, adjustment to achieve mechanical accuracy for each of the mechanical systems, and adjustment to achieve electrical accuracy for each of the electrical systems are performed. It is desirable that the exposure device is assembled in a clean room whose temperature and degree of cleanliness are controlled.

Mechanical connections, wiring connections between electrical circuits, and pipe connections between air pressure circuits and temperature control systems between each of the various subsystems are included in the steps to assemble an exposure device from the various subsystems. Looking at the temperature control system, the pipes of the temperature control system differ in accordance with the installation conditions of the exposure device 1. Therefore, after the assembly (i.e., the installation) of the exposure device 1 has ended, an operator operates the input device 97 shown in FIG. 5 and inputs the pipe length from the heater 75 to the reticle stage 2, the pipe length from the heater 78 to the wafer stage 5, and also information relating to the flow rate and flow velocity of coolant that is flowing inside the respective pipes (i.e., an input step). Because the first circulation system C1 is provided inside the exposure device 1, there is no change in the length of the coolant circulation path, however, this circulation path length may also be input together with the others.

When the information relating to the pipe length and the flow amount and flow rate of the coolant has been input via the device 97, this information is output from the main control system 95 to the controllers 67 and 77. The information is input into the setting sections 116 and 117 (see FIG. 8) that are provided in the controllers 67 and 77, and in the calculation sections 121 (see FIG. 9) inside the setting sections 116 and 117, the optimum control amounts (i.e., control characteristics) that should be set respectively in the FF controller 113 and the PID controller 112 are calculated based on the reference control amount that is stored in the storage section 120 and on the input pipe length and the like. The setting sections 116 and 117 then set the optimum control amounts that have been calculated by the calculation sections 121 respectively in the FF controller 113 and the PID controller 112 (i.e., an input step).

Figure 12:
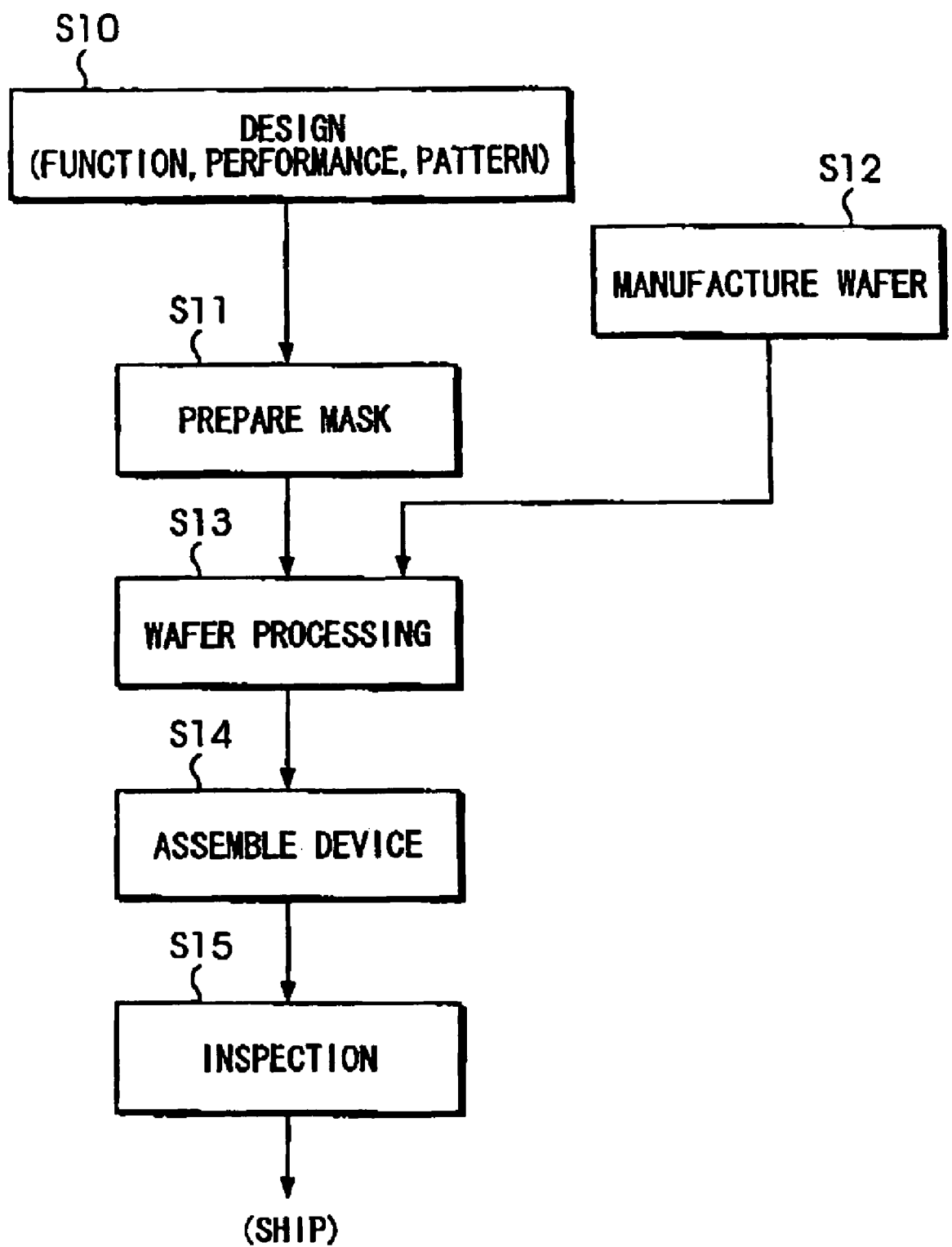
FIG. 12 is a flow chart showing an example of a process to manufacture a device, (for example, a semiconductor chip such as an IC and LSI, a liquid crystal panel, a CCD, a thin-film magnetic heat, a micromachine and the like) using the exposure device and exposure method according to an embodiment of the present invention.

Next, a description will be given concerning device manufacturing that uses the exposure device and exposure method of an embodiment of the present invention. FIG. 12 is a flowchart showing an example of steps to manufacture a device (for example, a semiconductor chip such as an IC or LSI chip, a liquid crystal panel, a CCD, a thin-film magnetic head, a micro machine and the like) using the exposure device and exposure method of an embodiment of the present invention. As is shown in FIG. 12, firstly, in step S10 (a design step), the functional design phase (for example, the circuit design of a semiconductor device and the like) of the device is performed, and a pattern is designed in order to achieve those functions. Next, in step S11 (a mask manufacturing step), a mask on which the designed circuit pattern has been formed is manufactured. Meanwhile, in step S12 (a wafer manufacturing step), a wafer is manufactured using a material such as silicon.

Next, in step S13 (a wafer processing step), using the mask and wafer prepared in steps S10 to S12, an actual circuit or the like is formed on the wafer using lithographic technology. Next, in step S14 (an assembly step), a chip is formed using the wafer that was processed in step S13. In step S14, steps such as an assembly step (i.e., dicing and bonding) and a packaging step (i.e., enclosure in a chip) are included in the assembly step. Finally, in step S15 (an inspection step), inspections such as an operation verification test, a durability test, and the like are performed on the device manufactured in step S15. After passing through these steps, the devise is completed, and the completed device is shipped.

As has been described above, according to the exposure device according to the first embodiment of the present invention, in the first control system 61 and the second control system 61, because temperatures that vary in accordance with the driving of movable members such as the actuators 104b, 104d, 104e, 104f, and 104g that are provided in the reticle stage 2, the wafer stage 5, and the projection optical system PL are controlled using feedback control together with feedforward control, it is possible to control the temperatures with a high degree of accuracy even if a delay time is generated in the control. Accordingly, as a result of the temperature inside the exposure device 1 being kept at a target temperature, reductions in positioning accuracy and superpositioning accuracy, reductions in resolution, and reductions in the positioning accuracy of the stage that are due to base line drift do not occur, and it is possible to stabilize the performance of the exposure device and maintain it at the expected performance. Moreover, the manufacturing efficiency of the device can be improved.

In the above described embodiment, a structure is employed in which the control amount and control timing of the feedforward control as well as the control constant and control timing of the PID control are calculated based on pipe information (i.e., pipe length and pipe diameter) that relates to the pipes through which coolant flows and on fluid information (i.e., flow rate and flow velocity) that relates to the fluid flowing through those pipes, or in which the control amount and control timing of the feedforward control as well as the control constant and control timing of the PID control are determined by making an appropriate selection or by performing an interpolation calculation using tables in which corresponding relationships between each of the aforementioned control amount and each of the aforementioned items of information have been stored. However, the control amounts, control constants, and control timings of the feedforward control and the PID control in the present invention may also be set based on information other than the above described information.

A method of setting the control amounts, control constants, and control timings based on information other than the above described information will now be described.

In a typical exposure device, in accordance with procedures for transferring a circuit pattern (i.e., a device pattern) by exposure onto a substrate (i.e., a photosensitive substrate such as silicon wafer or a glass plate), and with programs (i.e., processing programs) showing device information (i.e., pattern information), the circuit pattern is sequentially transferred onto the substrate while exposure conditions (i.e., illumination conditions and amount of exposure and the like) are being controlled, while the timing at which the exposure is performed is being controlled, and while movements (i.e., amount of movement, direction of movement, stage speed, stage acceleration, number of movements, movement timing, and the like) of the mask stage and the substrate stage are being controlled. Normally, this processing program is set to appropriate desired contents by a user.

In this process program are included the state of arrangement on the substrate of the plurality of shot areas that are to be transferred onto the substrate, the configuration and size of the shot areas that are to be onto the substrate, and information relating to the exposure shot areas such as the number of shots that are to be transferred onto a single substrate (this is referred to here as "shot map information"). Normally, the smaller the shot size, the greater the number of shots that can be transferred onto a single substrate. As a result, the smaller shot size (in other words, the greater the number of shots) the greater the number of movements of the substrate stage and the mask stage, and the greater the number of accelerations and decelerations of the motors driving these stages. Therefore, inevitably, the heat output from these motors also increases. Conversely, the greater the shot size (i.e., the fewer the number of shots), the fewer the number of accelerations and decelerations of the motors used to drive the stages, resulting in the heat output from these motors also tending to decrease. Therefore, it is desirable that the setting sections 116 and 117 calculate the optimum control amounts for the FF controller 113 and the PID controller 112 using this type of shot map information.

For example, it is desirable that the feedforward component FFC described in the above embodiment (FIG. 11) is controlled with consideration given not only to the above described pipe information and fluid information, but also to the aforementioned shot map information. Specifically, the FFC control amount may be calculated as a shot map information (i.e., shot number and shot size) function such that when there is a large number of shots, the amount of change (i.e., the control amount) in the FFC is equal to or above a predetermined amount, and when there is a small number of shots, the amount of change in the FFC is less than a predetermined amount. Moreover, at this time, the method used is not limited to calculating the FFC control amount as a function, and it is also possible to prepare in advance a table showing relationships between the amount of change in the FFC and the shot map information (i.e., shot number and the like) that have been determined in advance by experiment or simulation (and storing this table in the storage apparatus 96), and when the exposure device is being used, an FFC control amount that corresponds to the shot number can be selected and used. Furthermore, it is also possible for not only the FFC control amount, but also for the control timing to be set as a shot map information function (for example, if the shot number is greater than a predetermined number, the control timing of the heater output H2 may be set faster than the control timing when the shot number is less than a predetermined number).

Moreover, in some scanning exposure devices, it is possible to choose whether to make the stage scan direction (i.e., the direction of movement of the wafer stage) when each shot is being scan exposed the same direction for each shot (referred to below as a "one-directional scan method"), whether to reverse the scan direction substantially for each shot (in a portion of the shots, the scan direction may be made the same as the scan direction from the previous shot exposure) (referred to below as a "alternating scan method"), or whether to reverse the scan direction without fail for each shot (referred to below as a "full alternating scan method"). The scan direction information for these scan exposures can be optionally set by a user of the exposure device as exposure sequence information in the processing program. The scan direction for the mask stage can also be set to the appropriate direction to command to the scan direction of the wafer stage.

In the alternating scan method and full alternating scan method, a structure is employed in which stage scanning is only performed once in the scan exposure of a single shot, for example, in the first shot, scanning is performed from the near side towards the rear side of the drawings in FIG. 1 and FIG. 2 (i.e. in the negative Y direction), in the second shot, scanning is performed from the rear side towards the near side of the drawings in FIG. 1 and FIG. 2 (i.e., in the positive Y direction), while in the third shot, scanning is again performed in the negative Y direction). In contrast to this, in the case of the one-directional scan method, because in the first shot, the second shot, and the third shot, exposure is performed in a one-directional scan in a predetermined scan direction (for example, in the negative Y direction), when the scan exposure of the first shot is ended, the stage must be undergo a return movement (this is a stage movement in the positive Y direction, and during this time the exposure of the second shot cannot be performed) in order for the scan exposure of the second shot to be performed. In the one-directional scan method, the number of stage movements (i.e., the number of accelerations and decelerations of the motors) is greater than in the alternating scan method and the full alternating scan method by the number of these return movements. Therefore, the heat output from the motors is also greater by this amount. In the one-directional scan method, because not only the wafer stage 5, but the reticle stage 2 and commonly known reticle blinds (i.e., synchronous blinds—not shown) must also undergo the aforementioned return movement, the heat output from the exposure device as a whole tends to increase in the one-directional scan method.

Therefore, it is desirable that the setting sections 116 and 117 calculate the optimum control amounts for the FF controller 113 and the PID controller 112 using exposure sequence information (i.e., scan method information) such as that described above.

For example, it is desirable that the feedforward component FFC described in FIG. 11 is controlled with consideration given to the above described exposure sequence information (i.e., scan method information). Specifically, the FFC control amount may be calculated as an exposure sequence information (i.e., scan method information) function such that when the one-directional scan method is set, the amount of change (i.e., the control amount) in the FFC is set to equal to or above a predetermined amount, and when the alternating scan method or full alternating scan method has been set, the amount of change in the FFC is less than a predetermined amount. Moreover, at this time it is also possible to prepare in advance a table showing relationships between the scan method and the FFC control amount, and an FFC control amount that corresponds to the scan method that has been set can be selected. Furthermore, it is also possible for not only the FFC control amount but also for the control timing to be set as an exposure sequence information function (for example, in the case of the one-directional scan method, the control timing of the heater output H2 may be set faster than the control timing for the alternating scan method).

The information that can be optionally set by an operator includes information relating to the speed and the acceleration of the stages (i.e., the wafer stage and the mask stage) during scanning exposure. Depending on the user, there may be a desire to place emphasis on the printing accuracy of the pattern rather than on throughput. In this case, operational control is set such that scan driving is performed with fixed limits (i.e., an upper limit and a lower limit) being set and without the stage being scan driven at the maximum speed and maximum acceleration. In particular, if the acceleration increases, or if the acceleration time is lengthened, this gives rise to a tendency for vibrations generated in the stage or body to increase. As a result, a user in some cases may set limits on the acceleration of the stage. There is a tendency for the motors driving the stages to have an increased heat output as the acceleration thereof increases.

Therefore it is desirable that the setting sections 116 and 117 calculate the optimum control amounts for the FF controller 113 and the PID controller 112 using the stage speed (velocity)/acceleration information (including the acceleration period).

For example, it is desirable that the feedforward component FFC described in FIG. 11 is controlled with consideration given to the above described stage speed/acceleration information. Specifically, the FFC control amount may be calculated as a stage speed/acceleration information function such that when the stage speed/acceleration is set to a predetermined stage speed/acceleration or greater (for example, is set to the maximum rate of acceleration for the drive capability of stage), the amount of change (i.e., the control amount) in the FFC is greater than a predetermined amount, and when the stage acceleration is set to less than a predetermined stage speed/acceleration, the amount of change in the FFC is less than a predetermined amount. The method used is not limited to calculating the FFC control amount as a function, and it is also possible to prepare in advance table showing relationships between the FFC control amount and the stage speed/acceleration information, and for the optimum FFC control amount that corresponds to the stage speed/acceleration information to be selected from this table. Furthermore, it is also possible for not only the FFC control amount, but also for the control liming to be set as a stage speed/acceleration information function (for example, if the acceleration is set to be greater than a predetermined acceleration, the control timing of the heater output H2 may be set faster than the control timing when the acceleration is set to be less than a predetermined acceleration).

The information making up the stage speed/acceleration information may include not only just the velocity values and acceleration values, but may also include information relating to the current and voltage that are applied to the motor.

A plurality of varieties of data in the information relating to the aforementioned processing program (i.e., the shot map information, the exposure sequence information and the stage speed (velocity)/acceleration information) may be incorporated in advance in exposure data files that are stored in the storage apparatus 96 shown in FIG. 5, and a user may be enabled to select them as is appropriate using the input device 97. Alternatively, a structure may be employed in which the user is able to input the information as is appropriate as a new exposure data file via the input device 97.

In the description of the above described embodiment, (i.e., in FIG. 11), for reasons of convenience, a description is given of when the feedforward component FFC is changed at the each of the points in time when the motors switch between ON and OFF (i.e., at t1 and t2). Several tens to several hundreds of exposure areas are present on a normal single wafer, and every scanning exposure of each shot and ever movement operation (i.e., stepping operation) of each shot, the turning ON and OFF or the acceleration and deceleration of the stage drive motors are repeated several (many) times.

However, in actual operation, it may be considered that there are few cases in which feedforward control is performed a large number of times (i.e., each time the motors are turned ON or OFF or are accelerated or decelerated) during the exposure processing of a single wafer. As has been described above, feedforward control is intended to be applied in cases when the response of feedback control (normally PID control) is not quick enough (i.e., timing) due to time constants and time wastage due to control (i.e., delay time). Therefore, from the point of view of temperature stability, it is desirable that feedforward control is performed only when there are major changes in the heat generation conditions (for example, only when the motors are first started up and when they are finally stopped) within a limited time (i.e., while a single wafer is being processed, or while a plurality of wafers are being processed consecutively). In other words, it is desirable that feedforward (FF) control that is linked to the ON/OFF of the motors is not conducted all the time, but that, depending on the conditions such as the exposure sequence, motor temperature control is performed that does not conduct FF control that is linked to the ON/OFF of the motors.

In a normal processing exposure step, a predetermined plurality of substrates (for example, 25) is taken as 1 lot, and that exposure processing (i.e., pattern transfer exposure processing) is performed in lot units consecutively on the plurality of substrates that make up each lot. The temperature control of the stage drive motors when the plurality of wafers in one lot are consecutively exposure processed using the exposure device shown in the above embodiment is desirably conducted with the starting of the exposure of the first shot on the leading wafer of the lot (i.e., the starting of the scan driving of the stages) taken as the time t1 shown in FIG. 11, and the ending of the exposure of the last shot on the final wafer of the lot (i.e., the ending of the scan driving of the stages) taken as the time t2 shown in FIG. 11. Namely, it is sufficient if feedforward (FT) control to abruptly lower the temperature of the coolant is performed when the stage scanning of the first shot on the leading wafer of the lot is started (i.e., when the stage motors are started up in order to commence the scanning exposure), and if thereafter (i.e., until prior to the stage scanning of the last shot on the final wafer of the lot being stopped) feedback (FB) control is performed, and if then feedforward (FF) control is performed to abruptly raise the temperature of the coolant when the stage scanning of the last shot on the final wafer of the lot is stopped (i.e., when the stage motors are stopped due to the ending of the scanning exposure). At this time, it is desirable, in consideration of thermal time constants and time wastage due to control corresponding to the pipe length that the commands in order to perform feedforward (FF) control are output at timings such that coolant that has undergone FF control arrives at the motors at the times t1 or t2. However, the present invention is still effective if the timings are such that the coolant arrives at a slightly later time than t1 and t2.

This type of control is not limited to control within one lot, and may also be applied in the same way when wafers undergo exposure processing continuously for a plurality of lots. For example, when the optimum exposure conditions (i.e., the optimum resist thickness, the optimum focus positions, the optimum exposure amount and the like) are being determined, a small number of wafers may be taken as one lot and exposure processing can be performed continuously on a plurality of lots (i.e., when there is a short downtime between lots). If processing is performed continuously on a fist lot through third lot with each lot having a small number of wafers, then the above described FF control can be performed when scanning exposure of the first shot on the leading wafer of the first lot is started, and when scanning exposure of the last shot of the final wafer of the third lot is stopped, and FB control can be performed between these.

To describe this in other words, if a period between when the motors am stopped until when the motors are started up next is within a predetermined time (for example, is less than 10 minutes), then motor temperature control is performed without employing FF control. In order to achieve this kind of control, it is sufficient to employ a structure in which a timer (i.e., the motor drive state sensor 98 shown in FIG. 5) is provided that starts measuring time from when the motor driving is stopped, and the period until when the motors are started up again next is recognized from the output from this timer 98, and in which operation control can then be performed by the main control system 95 such that, if this period is within a predetermined time, then FF control is not performed. A structure can also be employed in which, if the time measured by the timer 98 until the motor is started up again is within the predetermined time, then the temperature of the motors can be controlled using feedback (FB) control.

In this manner, it is desirable that the main control system 95 determines whether or not to perform FB control, and performs temperature control of the motors in accordance with the output from the motor drive state sensor (i.e., the timer) 98.

In the above, an example is given of when the time of the starting of the stage scanning of the first shot of the leading wafer of a lot and the time of the stopping of the stage scanning of the last shot of the last wafer are the timings for performing FF control. However, if describing the wafer stage 5, then the timing of the first startup of the stage driving motors from when a wafer is placed on the stage 5 is the time of a positioning operation when the position of the stage 5 is moved (within the exposure field of the projection lens) from a wafer replacement position (not shown) to the position for exposing the first shot on the wafer. Normally, because the stage scanning of the first shot is started immediately after this positioning operation, it can be considered that the heat output from the stage driving motors at the time of the positioning operation has an effect on the stage temperature during exposure. According, it is also possible to perform the FF control (i.e., the control to abruptly lower the temperature of the coolant) at a point in time that is earlier than the time when the wafer stage 5 starts the stage scanning of the first shot. For example, the FF control may be performed when the wafer stage 5 is positioned in the exposure position for the first shot of the leading wafer of a lot (for example, when the motor is started up when the wafer stage moves from the wafer replacement position to the first shot exposure position), and FB control may be performed when performing stage scanning of the first shot. It is also possible to perform FF control to abruptly raise the temperature of the coolant at a point in time after the stage scanning of the last shot of the final wafer has stopped (for example, at the point in time the driving of the stage drive motor to move the wafer stage 5 to the wafer replacement position has ended or immediately thereafter).

Next, a description will be given using examples of the method in which motor temperature control is performed when a motor stoppage period of a predetermined time or greater is measured by the timer 98.

In an exposure system in which a coder/developer apparatus (a C/D apparatus) and an exposure device are connected in-line, a loop is followed in which a wafer that has been coated with resist by a C/D apparatus is to a sequential exposure device and undergoes exposure processing. After this exposure processing, the wafer is once again transported to the C/D apparatus, and undergoes developing processing. In a state in which a wafer that has been coated with resist is sequentially transported without any stoppages to the exposure device (i.e., in a normal transporting state), the above described control (i.e., only the FF control of the first shot on the leading wafer of a lot and the last shot of the final wafer of the lot) may be performed for the temperature control of the stage driving motors during consecutive exposure processing of the wafers in one lot. However, it is not always certain that the wafer transporting state from the C/D to the exposure device will be a normal transporting state. There may be cases of abnormal states arising in which the next wafer is not transported to the exposure device due to some trouble or other occurring on the C/D apparatus side. Such wafer transporting abnormalities are not limited to the transporting process between the C/D apparatus and the exposure device, but may also occur in the transporting process as far as the wafer stage inside the exposure device. If, in this way, due to some kind of trouble, wafers are not transported consecutively to the wafer stage, resulting in it not being possible to perform exposure processing consecutively on the wafers, a state in which both the wafers and reticle stage are stationary (i.e., a state in which the motors are stationary) is lengthened, and the temperatures of the motors that had been controlled to predetermined temperatures gradually deteriorate. If this type of transporting abnormality occurs in the middle of a lot, and subsequently this transporting abnormality is mended so that the transporting of the remaining wafers to the wafer stage can be recommenced and an attempt can be made to recommence exposure processing, then it is desirable that, instead of FB control, FF control is performed for the first shot of the first wafer when exposure is recommenced.

In order to achieve this type of motor temperature control, it is sufficient to construct the control system 95 such that a timer (the timer 98 may also be used for this timer, or a separate timer may be provided) is provided in the exposure device that starts measuring time from the point when the driving of the stage driving motors is stopped due to the wafer transporting abnormality. The main control system 95 then identifies whether or not the stopped state of the motors has continued for a predetermined time or more (for example, 10 minutes or more) since the stage driving motors stopped. If a time passage equal to or greater than the predetermined time has been measured by the timer, FF control is performed for the first shot of the next wafer (i.e., at the scan driving start time) to be transported to the wafer stage. It is desirable that the control amount and control timing of the FF control at this time can be changed in accordance with the time measured by the timer (for example, it is desirable that the FF control amount is set as a function of the motor stoppage time such that the FF control amount when the motors have stopped for 15 minutes is greater than the FF control amount when the motors have stopped for 10 minutes.

The stage driving motors can be stopped not only when a wafer transporting abnormality occurs, but also when a problem occurs on the exposure device side. For example, it alignment marks cannot be detected because of the effects of the wafer processing (for example, if good marks cannot be detected because of the effects of resist coating unevenness or of flattening processing or the like, or if mark detection itself is not possible due to a substance being coated over the marks that does not allow alignment light to pass through), or if the external configuration or flatness of the wafer have deteriorated because of the effects of the wafer processing (for example, the effects of heat processing or flattening processing on the wafer), then the exposure device may require relief processing by a user (i.e., assistance processing from an operator). The exposure device tends to be stopped during the period of this assistance processing. There are also cases when the exposure device is stopped due to a power failure or an earthquake or the like, and cases when the stage driving motors are stopped due to a malfunction of a stage apparatus or the like. Alternatively, in an exposure system that is provided with a plurality of wafer stages, movement control is required such that the plurality of stages do not interfere with each other mechanically, however, in order to avoid mechanical interference between stages, there may be cases in which the stopping of one stage cannot be avoided. By starting up the above described timer for various abnormalities such as these, the above described temperature control of the stage driving motors can be performed.

In this way, it is desirable that the setting sections 116 and 117 are able to calculate optimum control amounts for the FF controller 113 and the PID controller 112 using information showing the operating states of the stage driving motors (i.e., motor stoppage period information) as is described above.

As has been described above, the performing of more accurate feedforward control is made possible by calculating and setting optimum control amounts for the FF controller 113 and the PID controller 112 or by setting the control timings thereof based on information relating to processing programs (i.e., shot map information, exposure sequence information, and stage speed (velocity)/acceleration information (including acceleration information)) and on information on the operating states of the stage driving motors and the like. In addition, based on the information on the operating states of the stage driving motors, as a method for temperature control of the motors, it is possible to achieve more practical temperature control in comparison with the exposure sequence by making a distinction between use and non-use of FF control.

Second Embodiment

Figure 13:
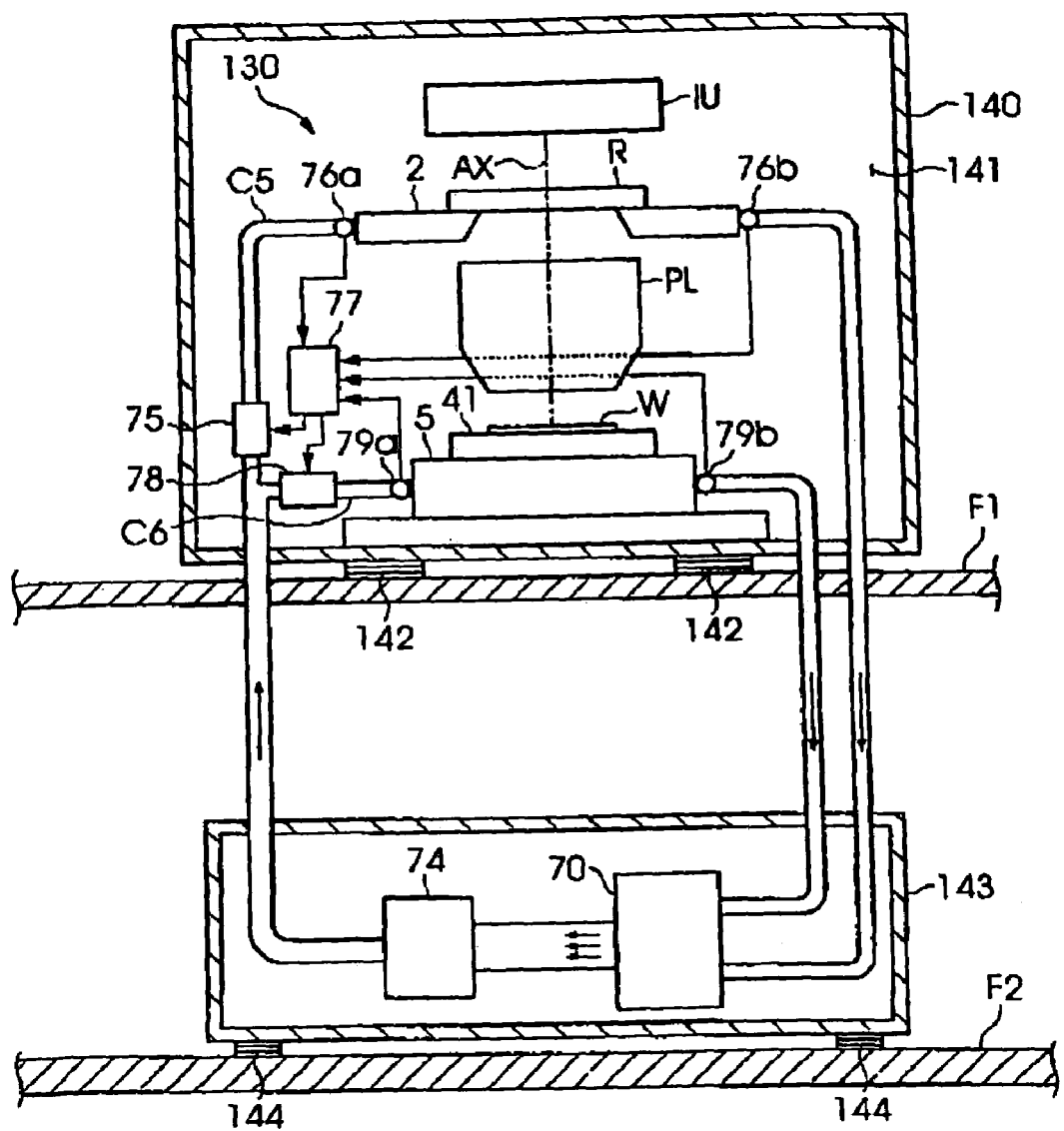
FIG. 13 is a schematic view of an exposure device according to the second embodiment of the present invention.

FIG. 13 is a schematic view of an exposure device according to the second embodiment of the present invention. In FIG. 13, the same symbols are allocated to members that correspond to members shown in the first embodiment, and a description thereof is omitted. As is shown in FIG. 13, the exposure device of the present embodiment can be broadly separated into an exposure chamber 140 that houses an exposure main body section 130 that is formed so as to include an illumination optical system IU, a reticle stage 2, a projection optical system PL, and a wafer stage 5 serving as subjects of control, and also a cooling apparats 143 that cools coolant circulating inside the exposure main body section 130.

The exposure chamber 140 that houses the exposure main body section 130 is placed on a floor F1 via seismic isolation pads 142 and 142. The cooling apparatus 143 is placed on a floor F2 that is positioned under the floor 1 via seismic isolation pads 144 and 144, so that the exposure chamber 140 and the cooling apparatus 143 are located separately. Pipes are provided between the exposure camber 140 and the cooling apparatus 143, and, in the same way as the temperature control system shown in FIG. 5, a temperature control system formed by the circulation system C5 and the circulation system C6 is provided.

In the exposure device of the present embodiment, in addition to the aforementioned exposure main body section 103, the heaters 75 and 78 and the controller 77 that form a portion of the second control system 62 shown in FIG. 5 are housed inside a thermostatic chamber 141 of the expose chamber 140. Moreover, although not shown in FIG. 13, the controller 67 that forms a portion of the first control system 62 shown in FIG. 5 and a heater corresponding to the heater 71 that is driven by the controller 67 are also housed in the thermostatic chamber 141. These heaters that are provided inside the thermostatic chamber 141 of the exposure chamber 140 correspond to the second setting device described in the present invention, and the controller corresponds to the control device described in the present invention.

The cooling apparatus 143 that is placed on the floor F1 includes the heat exchanger 70 and the pump 74 that are shown in FIG. 5. Although not shown in FIG. 13, the cooling apparatus 143 is constructed to include the refrigerating machine 73 and the evaporator 65 shown in FIG. 5 in addition to the heat exchanger 70 and the pump. This cooling apparatus 143 corresponds to the first setting device described in the present invention. In this way, the exposure device of the present embodiment is constructed with the cooling apparatus 143, serving as the first setting device, separate from the heaters serving as the second setting device and the controller serving as the control device. In addition, the heaters serving as the second setting device and the controller serving as the control device are placed adjacent to the reticle stage 2, the projection optical system PL, and the wafer stage 5 and the like.

The reason why this structure is employed is to place the heaters 75 and 78, which control temperature, close to the objects of their control, result in time wastage due to control being shortened. As a result, the temperature of the objects being controlled is controlled with a high degree of accuracy. Another reason for employing this structure is that, because the temperature control system provided in the exposure device of the present embodiment controls the temperature of coolant circulate through the circulation system C5 and C6 using feedforward control based on detection results from the temperature sensors 76a, 76b, 79a, and 79b, in the same way as in the temperature control system of the first embodiment (see FIG. 5), a high ratio between the level of the detection results from the temperature sensors 76a, 76b, 1 79a, and 79b and the like and the level of noise (i.e., the S/N ratio) is preferable from the viewpoint of control. In the present embodiment as well, in the same way as in the first embodiment, it is preferable that feedback control is used together with feedforward control.

Because an extremely short amount of time wastage due to control is preferable, the closer that the heaters 75 and 78 and the like are placed to the objects of control, the better. However, because a variety of members are placed inside the thermostatic chamber 141 of the exposure chamber 140 in addition to the structure shown in FIG. 13, it is not guaranteed that the heaters 75 and 78 can be placed in optional positions. Therefore, the heaters 75 and 78 may be placed as close to an object of control as still allows a constant response large enough to enable the temperature inside the thermostatic chamber 141 to be kept within allowable temperature change values that are required in order to maintain the performance of the exposure device, and as still enables an S/N ratio to be obtained from the temperature sensors 76a, 76b, 79a, and 79b.

Moreover, if the heaters 75 and 78 and the like are placed inside the thermostatic chamber 141 of the exposure chamber 140, the pipe length from the heater 75 to the reticle stage 2 and the pipe length from the heater 78 to the wafer stage 5 can be kept constant regardless of the condition in which the exposure device 1 has been installed. As a result, because it is possible to omit the tasks of setting the control constants and control timings of the PID controller 112 and the FF controller 113 that are provided in the controllers 67 and 77 described in the first embodiment, it is also possible to shorten the time required to install the exposure device 1. In the exposure device of the present embodiment, because the temperature control of control objects such as the reticle stage 2, the wafer stage 5, and the projection optical system PL is performed using the same feedback control and feedforward control as in the above described first embodiment, a description thereof is omitted.

In this embodiment, because a structure is employed in which the heaters 75 and 78 are placed inside the thermostatic chamber 141 of the exposure chamber 140, it can be considered that the heat output from the heaters 75 and 78 has an effect on the temperature stability inside heat thermostatic chamber 141. In order to reduce the effects of the heat output from the heaters 75 and 78 on the temperature environment inside the thermostatic chamber 141, a structure may be employed in which the area surrounding each heater is covered by a casing (not shown) and this casing is covered with an insulating material (not shown). Furthermore, the area surrounding this insulating material may be air-conditioned by a gas that is controlled to a predetermined temperature.

Moreover, if it is necessary to consider the changes to the temperature environment inside the thermostatic chamber 141 by the coolant flowing through the pipes C5 and C6, then a structure can be employed in which the pipes are covered by insulating material. In this case, a structure can be employed in which not only the pipes C5 and C6, but all the pipes placed inside the thermostatic chamber 141 are covered by insulating material.

Third Embodiment

In the above described first embodiment and second embodiment, the temperature of the reticle stage 2 is determined by providing temperature sensors 76a and 76b that respectively detect the temperature of the coolant before it is circulated around the reticle stage 2 and the temperature of the coolant after it has circulated around the reticle stage 2, and then taking the average of these detection results. In addition, the temperature of the wafer stage 5 is determined by providing temperature sensors 79a and 79b that respectively detect the temperature of the coolant before it is circulated around the wafer stage 5 and the temperature of the coolant after it has circulated around the wafer stage 5, and then taking the average of these detection results.

Figure 14:
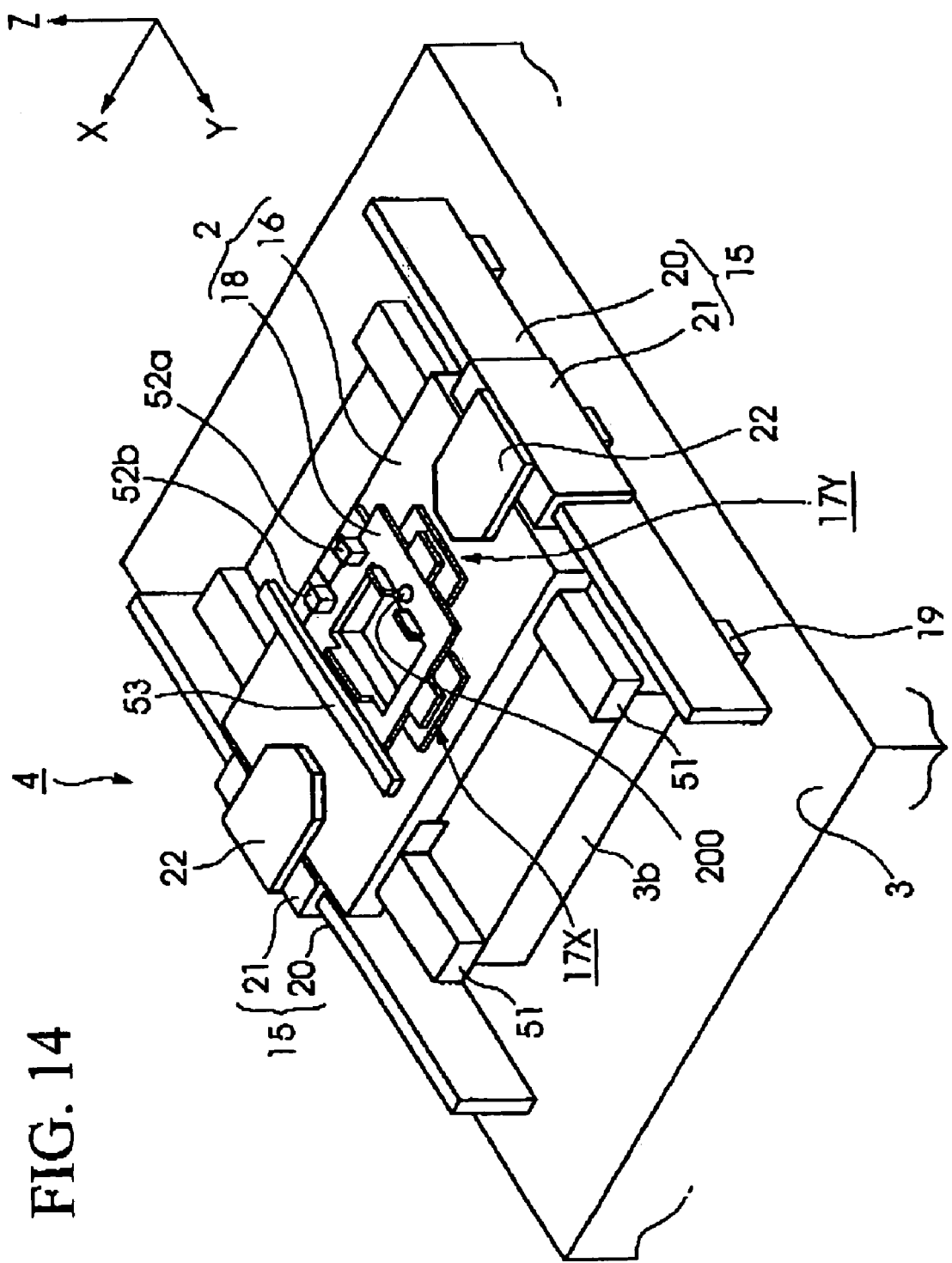
FIG. 14 is an external perspective view of a reticle stage that is provided in an exposure device according to the third embodiment of the present invention.
Figure 15:
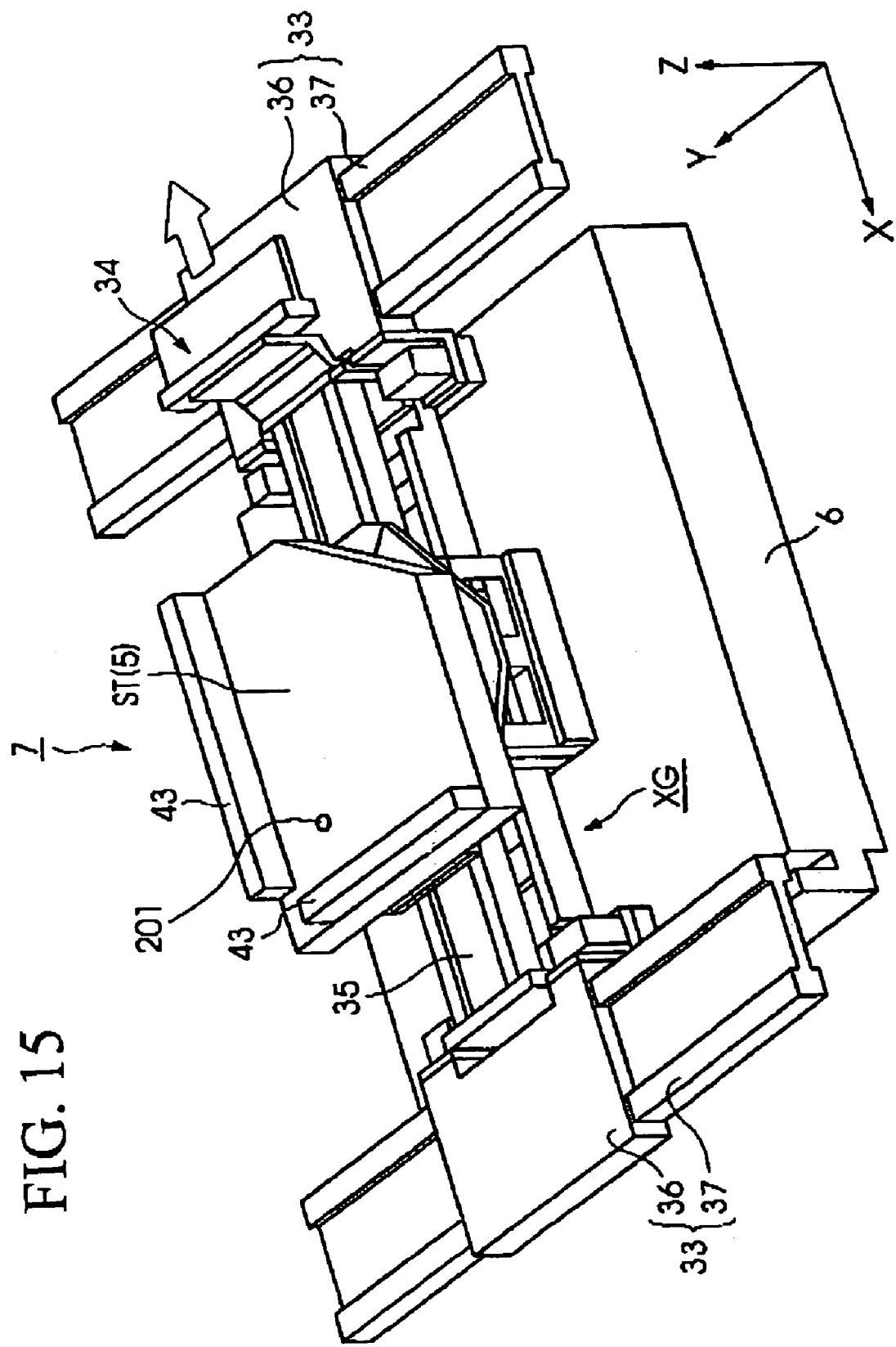
FIG. 15 is an external perspective view of a wafer stage that is provided in an exposure device according to the third embodiment of the present invention.

However, as is shown in FIG. 14 and FIG. 15, it is also possible to directly detect the temperatures of the reticle stage 2 and the wafer stage 5. FIG. 14 is an external perspective view of a reticle stage that is provided in the exposure device according to the third embodiment of the present invention, while FIG. 15 is an external perspective view of the wafer stage that is provided in the exposure device according to the third embodiment of the present invention. The reticle stage shown in FIG. 14 differs from the reticle stage shown in FIG. 2 in that a temperature sensor 200 that detects the temperature of a reticle fine movement stage 18 is provided, while the wafer stage shown in FIG. 15 differs from the wafer stage shown in FIG. 4 in that a temperature sensor 201 is provided in the wafer stage 5.

The temperature sensors 200 and 201 are mounted on the reticle fine movement stage 18 and the wafer stage 5 in a state of being embedded therein, and directly detect the temperatures respectively of the reticle fine movement stage 18 and the wafer stage 5. The temperature sensors 200 and 201 may be mounted on the reticle fine movement stage 18 and the wafer stage 5 in a state of being completely embedded therein, or may be mounted thereon in a state of being partially exposed. If a state in which the temperature sensor 201 is partially exposed is selected, then it is necessary to locate the temperature sensor 201 in a position slightly away from the position where the wafer W is placed. Detection results from the temperature sensors 200 and 201 are output to the controller 77 shown in FIG. 5. It is to be understood that the positions where the temperature sensors 200 and 201 shown in the examples in FIG. 14 and FIG. 15 are mounted are merely examples, and the temperature sensors 200 and 201 can be placed in any position that is convenient for controlling the temperatures of the reticle stage 2 and the wafer stage 5 with a high degree of accuracy. Moreover, it is not essential that the temperature sensor 200 be mounted on the reticle fine movement stage 18, and it may also be mounted on the reticle coarse movement stage 16. In addition, it is also possible to mount not just one temperature sensor, but to mount a plurality of temperature sensors and to perform predetermined calculation processing (for example, averaging pressing) on the detection results from each temperature sensor.

Fourth Embodiment

Figure 16:
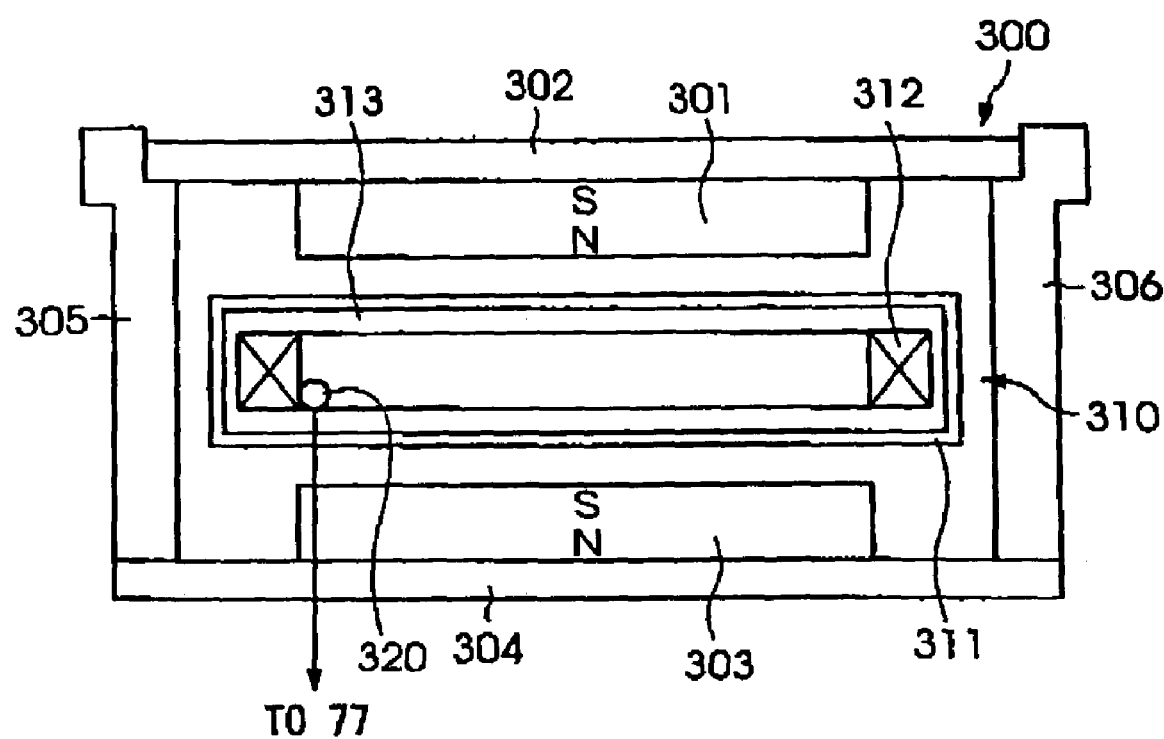
FIG. 16 is a cross-sectional view of a surface that is orthogonal to a direction of movement of a linear motor that is provided in an exposure device according to the fourth embodiment of the present invention.

In the above described third embodiment, temperature sensors are mounted in order to detect the temperatures in the reticle stage 2 and the wafer stage 5 that serve as movable devices, however, it is also possible to mount temperature sensors on the Y linear motors 15 and 15, the X voice coil motor 17X, and the Y voice coil motor 17Y, as well as on the linear motors 33 and 33, and the X linear motor 35 that serve as drive sources in order to detect the temperatures thereof. FIG. 16 is a cross-sectional view of a surface that is at a right angle to the direction of movement of a linear motor that is provided in the exposure device according to the fourth embodiment of the present invention. The linear motor shown in FIG. 16 can be used as the Y linear motors 15 and 15, the X voice coil motor 17X, and the Y voice coil motor 17Y that are provided in the reticle stage 2, and can also be used as the linear motors 33 and 33 and the linear motor 35 that are provided in the wafer stage 5.

The linear motor shown in FIG. 16 is a moving coil type of linear motor, and is formed by a fixed element 300 and a movable element 310. The fixed element 300 is constructed such that different polarities of a magnet 301 that is mounted on a yoke 302 and a magnet 303 that is mounted on a yoke 304 face each other, with these magnets being supported by fixed yokes 305 and 306. The movable element 301 is formed by a jacket 311, a coil 312, and a temperature sensor 320, and is located between the magnet 301 and the magnet 303. The coil 312 is placed in the interior 313 of the jacket 311, and is constructed such that a coolant is introduced into the interior 313 to cool the coil 312.

It is preferable that the temperature sensor 320 be placed in the vicinity of the coil 312 which gives off heat when energized. In FIG. 16, only one temperature sensor 320 is shown, however, it is also possible to provide a plurality of temperature sensors in the movable element 310. In this way, in the present embodiment, because it is possible to locate the temperature sensor 320 in the vicinity of the coil 312, which serves as a source of heat, so that changes in temperature inside the linear motor can be accurately detected, it is possible to accurately control the temperature inside the exposure device.

The above is a description of embodiments of the present invention, however, the present invention is not limited to these embodiments, and modifications can be made without departing from the spirit or scope of the present invention. For example, in the above described embodiments, an example of a structure that controls the temperatures of objects being controlled such as the reticle stage 2, the wafer stage 5, and the projection optical system PL by controlling the temperature of a coolant flow amount is described, however, the present invention is not limited to this, and it is also possible to employ a structure in which the temperatures of objects being controlled are controlled by controlling the flow velocity and flow rate of the coolant. In this case, it is preferable that the control amount of the feedforward control can be changed in accordance with the flow velocity or flow rate.

A liquid coolant or vapor coolant can be used as the coolant in the above described embodiments. Furthermore, it is also possible to directly control the temperature of the objects being controlled by using temperature regulating elements such as Peltier elements or the like without using coolant. Moreover in the above described embodiments, a structure is employed in which the same type of coolant (HFE) is used, however, it is also possible to use a different coolant for each circulation system in accordance with the installation environment and the temperature control accuracy that is required in each circulation system.

Moreover, in the above described embodiments, examples are given in which the movable devices are formed by the reticle stage 2, the wafer stage 5, the split lens barrels 100b, 100d, 100e, 100f, and 100g, and the alignment sensors, however, in addition to these, the movable devices are movable members that are provided inside the exposure device 1 such as the reticle blinds that are provided inside the elimination optical system IU and adjust the shape of the illumination light into a rectangular configuration, and the movable devices include all members that require temperature control.

In addition, each block that makes up the controller 77 shown in FIG. 8 may be formed as hardware using electronic circuits, or may be formed using software. If each block is formed using software, then the functions of each block can be achieved by a central processing unit (CPU) executing a program defining the functions of each block. Furthermore, in the above described embodiments, a structure is employed in which a portion of a temperature regulator (i.e., the heat exchanger 70) is shared by a pump for driving coolant, however, it is also possible to employ a variety of structures such as a structure in which a separate temperature regulator and pump are provided for each object of control (i.e., circulation system), and a structure in which the temperature regulator and pump are shared by all of the circulation systems.

Moreover, in the above described embodiments, a structure is employed in which a simple average is taken of a coolant temperature before the coolant circulates around the reticle stage 2 and the wafer stage 5 and a coolant temperature after the coolant has circulated around the reticle stage 2 and the wafer stage 5, however, it is also possible for a weighted average calculation to be taken. One of the methods described below can be employed as the method for taking a weighted average.

(1) When the distance from a heat source such as a motor to the position where the intake side temperature sensor is placed is different from the distance from the heat source to the position where the exit side temperature sensor is placed, weighting can be made in accordance with the distance such as by increasing the weighing of the detection result for temperature sensors whose distance is closer.

(2) When the material forming the vicinity of the intake of a heat source such as a motor is different from the material forming the vicinity of the exit of the heat source, weighting can be made in accordance with the properties of the materials such as the thermal conductivity thereof (for example, increasing the weighting for the material whose endothermic ratio is greater (i.e., whose thermal conductivity is greater)).

(3) When a separate heat source is present in the vicinity of the intake or the vicinity of the exit, weighting can be made in accordance with the existence or otherwise of this separate heat source and the heat output amount thereof. For example, if another heat source is present on a flow path, the weighting can be increased for the temperature sensor output that is closest to the other heat source. In addition, if another heat source is present outside the flow path, because heat output from this other heat source is transmitted to the temperature sensor via air, the weighting can be increased for the temperature sensor output that is closest to this other heat source.

(4) When the baseline is being measured, the detected temperature on the input side temperature sensor, the detected temperature on the output side temperature sensor, the coolant control temperature (i.e., the control temperature calculated using, simple averages), and the measured baseline quantity (or the amount of variation in the baseline quantity) are stored as a group, and this storage operation is repeated every time the baseline is measured. An estimation calculation is then made based on an accumulated plurality of data groups regarding to what extent weighting the intake side temperature would give the least baseline variation or to what extent weighting the exit side temperature would give the least baseline variation. Based on the estimate weighting, a weighting average is then taken.

Furthermore, in each of the above described embodiments, a structure is employed in which the temperature of the wafer stage 5 and the temperature of the reticle stage 2 are controlled by the same controller 77 (i.e., the heater 75 and the heater 78 are temperature controlled by the same controller 77), however, the present invention is not limited to this, and it is also possible to employ a structure in which the wafer stage system (i.e., the heater 78) and the reticle stage system (i.e., the heater 75) are both temperature controlled independently using separate dedicated controller that are independent of each other.

The substrate of the present embodiments is not limited to a wafer W of a semiconductor element, and a glass substrate for liquid crystal display devices, a ceramic wafer for thin-film magnetic heads, or the original plate (i.e., synthetic quartz or a silicon wafer) of a mask or reticle that is used in an exposure device may be used. In addition to a step-and-scan type of scanning exposure device that performs scanning exposure of the pattern on a reticle R while moving the reticle R and wafer W synchronously (i.e., a scanning stepper, see U.S. Pat. No. 5,473,410), as the exposure device 1 it is possible to use a step-and-repeat type of projection exposure device that exposes a pattern on the reticle R with the reticle R and wafer W in a stationary state and causes the wafer to move sequentially in steps. The type of exposure device 1 is not limited to an exposure device that is used for manufacturing semiconductor devices and that exposes a semiconductor device pattern on to a wafer W, and the present invention can also be broadly applied to exposure devices that are used to manufacture liquid crystal display elements, and to exposure devices that are used to manufacture thin-film magnetic heads. image pickup elements (i.e., CCD), or reticules or the like.

As the light source for the illumination light for exposure, it is possible to use an extra-high pressure memory lamp that emits luminescent g-rays (having a wavelength of 436 nm) or i-rays (having a wavelength of 365 nm), or a KrF excimer laser (having a wavelength of 248 nm), an ArF excimer laser (having a wavelength of 193 nm), an $F_2$ excimer laser (having a wavelength of 157 nm $Kr_2$ laser (having a wavelength of 146 nm, a YAG laser high frequency generator, or a semiconductor laser high frequency generator. In addition, it is possible to use charged-particle beams such as x-rays and electron beams. For example, if electron beams are used, a thermo-electronic emission type lanthanum hexaborite (LaB6) electron gun or a tantalum (Ta) electron gun can be used. Furthermore, if electron beams are used, a structure that uses the reticle R may be employed, or a structure that forms a pattern directly on a wafer without using the reticle R may be used.

Not only can a contraction system be used for the magnification of the projection optical system PL, but either of an equal magnification system and an enlargement system may also be used. When ultraviolet rays such as from an excimer laser are used for the projection optical system PL, then a material tat allows ultraviolet rays to pass through such as quartz or fluoride can be used for the nitric acid. If, however, an $F_2$ laser or x-rays are used, then a cata-dioptric optical system or a refractive optical system can be used for the projection optical system PL (a reflective type of reticle R is also used), while if electron beams are used, then and electron optical system formed by an electron lens and a deflector may be used for the optical system. It is to be understood that the optical path along which the election beams pass is placed in a vacuum state. It is also possible to refrain from using the projection optical system PL, and to place the reticle R and the wafer W in close contact with each other so as to form a proximity exposure device that exposes the pattern on the reticle R.

When a linear motor is used for the wafer stage 5 and the reticle stage 2 (see U.S. Pat. No. 5,623,853 or U.S. Pat. No. 5,528,118), it is possible to use an air flotation type of linear motor that uses an air bearing or a magnetic flotation type of linear motor that uses Lorentz's force or reactance force. Moreover, both the stage 2 and the stage 5 may be types that move along guides or may be guideless types for which no guides are provided.

For the drive mechanism of the reticle stage 2 and the wafer stage 5, it is possible to use a planar motor in which a magnetic unit (i.e., a permanent magnet), which is formed by arranging magnets two-dimensionally, and an armature unit, which is formed by arranging coils two-dimensionally, are placed facing each other so that the reticle stage 2 and the wafer stage 5 are moved by electromagnetic force. In this case, it is sufficient if one of either the magnetic unit and the armature unit is connected to the reticle stage 2 and the wafer stage 5, while the other of the magnetic unit and the armature unit is provided on the moving surface side (i.e., the base) of the reticle stage 2 and the wafer stage 5.

What is claimed is:

1. An exposure device which projects via a projection optical system an image of a pattern formed on a reticle that is held on a reticle stage onto a substrate that is held on a substrate stage, comprising:
    a movable device which is provided with a drive source and which performs a predetermined operation using the drive source; and
    a temperature control system which controls a temperature of the movable device using feedforward control, wherein
    the temperature control system controls the temperature of the movable device by circulating a temperature controlled fluid to the movable device, and comprises a detecting section which detects the temperature of the fluid, and
    the temperature control system controls the temperature of the movable device by also performing feedback control based on detection results from the detecting section.

2. An exposure device according to claim 1, wherein the temperature control system performs the feedforward control in at least one of a vicinity of a start time and a vicinity of an end time of an operation of the movable device.

3. An exposure device according to claim 1, wherein the temperature control system enables the control amount of the feedforward control to be changed in accordance with the contents of the control commands.

4. An exposure device according to claim 1, wherein the temperature control system enables the control amount of the feedforward control to be changed in accordance with at least one of the drive amount of the movable device and the number of times the movable device is driven.

5. An exposure device according to claim 1, wherein the detecting section detects a temperature of the movable device or a temperature in a vicinity of the movable device.

6. An exposure device according to claim 5, wherein at least a portion of the detecting section is embedded in the drive source.

7. An exposure device according to claim 1, wherein the temperature control system enables the control amount of the feedforward control to be changed in accordance with at least one of the flow rate and flow velocity of the fluid.

8. An exposure device according to claim 1, wherein the detecting section measures a temperature of the fluid before it circulates around the movable device and a temperature of the fluid after it has circulated around the movable device.

9. An exposure device according to claim 1, wherein the temperature control system controls the temperature of the drive source.

10. A device manufacturing method comprising a step of transferring a pattern formed on the reticle onto the substrate using the exposure device described in claim 1.

11. An exposure device according to claim 1, wherein the temperature control system enables the control amount of the feedforward control to be changed in accordance with the contents of a processing program relating to an exposure processing.

12. An exposure device according to claim 11, wherein the processing program includes at least one of information relating to a shot map, information relating to scanning method during scanning exposure, and information relating to a velocity, or an acceleration, or the acceleration period when the movable device is moved.

13. An exposure device according to claim 1, further comprising a measuring device which measures a period from when a driving of the movable device is stopped until a driving of the movable device is next started,
    wherein the temperature control system enables the control amount of the feedforward control to be changed based on measurement results from the measuring device.

14. An exposure device according to claim 1, wherein the temperature control system is able to perform temperature control using a control process other than the feedforward control, and
    the exposure device further comprises:
    a measuring device which measures a period from when a driving of the movable device is stopped until a driving of the movable device is next started; and
    a determining device which, based on measurement results from the measuring device, determines whether to execute the feedforward control or whether to execute a control process other than the feedforward control.

15. An exposure device which projects via a projection optical system an image of a pattern formed on a reticle that is held on a reticle stage onto a substrate that is held on a substrate stage, comprising:
    an object of control in which temperature variations are generated;
    a temperature control system which controls the temperature of the object of control by circulating a fluid to the object of control;
    an input device which inputs as a parameter at least one of information relating to pipes through which the fluid is circulated, information relating to a flow velocity of the fluid, and information relating to a flow rate of the fluid; and
    a setting device that sets control characteristics of the temperature control system based on the parameter information that is input by the input device,
    wherein the control characteristics include a control constant which relates to a control response when the temperature control system controls the temperature of the fluid, or information relating to a timing at which the temperature control system controls the temperature of the fluid.

16. An exposure device according to claim 15, wherein the temperature control system controls the temperature of the fluid using at least one of a feedforward control method and a feedback control method, and
    the control constant includes a control constant for the feedforward control or a control constant for the feedback control.

17. An exposure device according to claim 15, wherein the setting device comprises:
    a storage section which stores reference control characteristics that are determined for one representative value of the parameters; and
    a calculation section which, based on the parameter information that is input by the input device and on the reference control characteristics that are stored in the storage section, calculates an optimum value for the control characteristics of the temperature control system for the information input by the input device,
wherein the setting device sets the optimum value calculated by the calculation section as the control characteristics.

18. An exposure device according to claim 15, wherein the information relating to pipes includes at least one of information on a length of the pipes from a location where the temperature of the fluid is finally controlled to a location where the fluid arrives at the object of control, and information on a diameter of the pipes.

19. An exposure device according to claim 15, wherein the temperature control system controls the temperature of at least one of a drive source that drives the reticle stage and a drive source that drives the substrate stage as the object of control.

20. A device manufacturing method comprising a step of transferring a pattern formed on the reticle onto the substrate using the exposure device described in claim 15.

21. An exposure device comprising:
an exposure main body section which projects via a projection optical system an image of a pattern formed on a reticle that is held on a reticle stage onto a substrate that is held on a substrate stage; and
a temperature control system which controls a temperature of an object of control, in which temperature variations are generated, by circulating a fluid to the object of control,
wherein the temperature control system comprises:
a first setting device which sets the temperature of the fluid within a predetermined temperature range;
a second setting device which sets the temperature of the fluid that is temperature controlled by the first setting device within a temperature range that is smaller than the predetermined temperature range; and
a control device which controls an operation of at least the second setting device, and
the second setting device and the control device are located away from the first setting device, and also closer to the vicinity of the object of control than the first setting device.

22. An exposure device according to claim 21, wherein the second setting device and the control device are placed at a position close enough to the object of control such that a control level relating to the response control when the control object is being temperature controlled is less than a predetermined level.

23. An exposure device according to claim 21, comprising an exposure chamber in whose interior is placed the exposure main body section,
wherein the second setting device and the control device are placed inside the exposure chamber, and
the first setting device is placed outside the exposure chamber.

24. A device manufacturing method comprising a step of transferring a pattern formed on the reticle onto the substrate using the exposure device described in claim 21.

25. An exposure method which projects via a projection optical system an image of a pattern formed on a reticle that is held on a reticle stage onto a substrate that is held on a substrate stage, comprising:
an input step of inputting as a parameter at least one of information relating to pipes through which the fluid is circulated to an object of control, information relating to a flow velocity of the fluid, and information relating to a flow rate of the fluid; and
a setting step, based on the parameter information that is input in the input step, of setting control characteristics of a temperature control system that controls the temperature of the object of control by circulating the fluid to the object of control,
wherein the control characteristics include a control constant that relates to a control response when the temperature control system controls the temperature of the fluid, or information relating to a timing at which the temperature control system controls the temperature of the fluid.

26. An exposure method according to claim 25, wherein the temperature control system controls the temperature of the fluid using at least one of a feedforward control method and a feedback control method, and
the control constant includes a control constant for the feedforward control or a control constant for the feedback control.

27. An exposure method according to claim 25, wherein the information relating to pipes includes at least one of information on a length of the pipes from a location where the temperature of the fluid is finally controlled to a location where the fluid arrives at the object of control, and information on a diameter of the pipes.

28. An exposure device which projects via a projection optical system an image of a pattern formed on a reticle that is held on a reticle stage onto a substrate that is held on a substrate stage, comprising:
an object of control in which temperature variations are generated;
a temperature control system which controls the temperature of the object of control by circulating a fluid to the object of control;
an input device which inputs as a parameter information relating to an exposure procedure for exposing a pattern on the reticle onto the substrate; and
a setting device which sets control characteristics of the temperature control system based on the parameter information that is input by the input device.

29. An exposure device according to claim 28, wherein the information relating to the exposure procedure includes at least one of information relating to a shot map, information relating to the scanning method during scanning exposure, and information relating to a velocity, or an acceleration, or the acceleration period when the object of control is moved.

30. An exposure device according to claim 28, wherein the control characteristics include a control constant which relates to a control response when the temperature control system controls the temperature of the fluid, or information relating to a control amount or control timing when the temperature control system controls the temperature of the fluid.

31. An exposure device which projects via a projection optical system an image of a pattern formed on a reticle that is held on a reticle stage onto a substrate that is held on a substrate stage, comprising:
a driving source which drives a movable device;
a temperature control system which controls the temperature of the driving source by circulating a fluid to the driving source;
a measuring device which measures a period from when the driving source stops a driving of the movable device until the driving source next restarts a driving of the movable device; and a setting device which sets control characteristics of the temperature control system based on the measurement results from the measuring device.

32. An exposure device which projects via a projection optical system an image of a pattern formed on a reticle that is held on a reticle stage onto a substrate that is held on a substrate stage, comprising:
a driving source which drives a movable device;
a temperature control system which controls the temperature of the driving source using a feedforward control method or a control method other than the feedforward control method by circulating a fluid to the driving source;
a measuring device which measures a period from when the driving source stops a driving of the movable device until the driving source next restarts a driving of the movable device; and
a determining device which, based on measurement results from the measuring device, determines whether to execute the feedforward control method in the temperature control system or whether to execute a control method other than the feedforward control method in the temperature control system.

33. An exposure method which projects via a projection optical system an image of a pattern formed on a reticle that is held on a reticle stage onto a substrate that is held on a substrate stage, comprising:
an input step of inputting as a parameter information relating to an exposure procedure for exposing a pattern on the reticle onto the substrate; and
a setting step, based on the parameter that is input in the input step, of setting control characteristics of a temperature control system that controls the temperature of an object of control, in which temperature variations are generated, by circulating fluid to the object of control.

34. An exposure method according to claim 33, wherein the information relating to the exposure procedure includes at least one of information relating to a shot map, information relating to the scanning method during scanning exposure, and information relating to a velocity, or an acceleration when the object of control is moved.

35. An exposure method according to claim 33, wherein the control characteristics include a control constant which relates to a control response when the temperature control system controls the temperature of the fluid, or information relating to a control amount or control timing when the temperature control system controls the temperature of the fluid.

36. An exposure method which projects via a projection optical system an image of a pattern formed on a reticle that is held on a reticle stage onto a substrate that is held on a substrate stage, comprising:
a measuring step of measuring a period from when a driving source that drives a movable device stops a driving of the movable device until the driving source next restarts a driving of the movable device; and
a setting step, based on measurement results from the measuring step, of setting control characteristics of a temperature control system that controls the temperature of the driving source by circulating fluid to the drive source.

37. An exposure method which projects via a projection optical system an image of a pattern formed on a reticle that is held on a reticle stage onto a substrate that is held on a substrate stage, comprising:
a measuring step of measuring a period from when a driving source that drives a movable device stops a driving of the movable device until the driving source next restarts a driving of the movable device; and
a determining step, based on measurement results from the measuring step, of determining which control method will be executed by a temperature control system that controls the temperature of the driving source using a feedforward control method or a control method other than a feedforward control method by circulating fluid to the driving source.

38. An exposure method which projects via a projection optical system an image of a pattern formed on a reticle that is held on a reticle stage onto a substrate that is held on a substrate stage, comprising:
performing feedforward control of a temperature of a movable device by circulating a temperature controlled fluid to the movable device;
detecting a temperature of the fluid; and
controlling the temperature of the movable device by also performing feedback control based on detection results of the temperature of the fluid.

39. An exposure device which projects via a projection optical system an image of a pattern formed on a reticle that is held on a reticle stage onto a substrate that is held on a substrate stage, comprising:
a movable device which is provided with a drive source and which performs a predetermined operation using the drive source; and
a temperature control system which controls a temperature of the movable device using feedforward control, wherein
the temperature control system controls the temperature of the movable device by circulating a temperature controlled fluid to the movable device, and performs feedforward control to the temperature of the fluid.

40. An exposure method which projects via a projection optical system an image of a pattern formed on a reticle that is held on a reticle stage onto a substrate that is held on a substrate stage, comprising:
controlling a temperature of a movable device by circulating a temperature controlled fluid to the movable device; and
performing feedforward control of a temperature of the fluid.

* * * * *